United States Patent
Mori

(10) Patent No.: US 10,439,582 B2
(45) Date of Patent: Oct. 8, 2019

(54) VARIABLE-FREQUENCY LC FILTER, HIGH-FREQUENCY FRONTEND MODULE, AND COMMUNICATION APPARATUS

(71) Applicant: Murata Manufacturing Co., Ltd., Kyoto (JP)

(72) Inventor: Hirotsugu Mori, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/130,224

(22) Filed: Sep. 13, 2018

(65) Prior Publication Data

US 2019/0013789 A1 Jan. 10, 2019

Related U.S. Application Data

(63) Continuation of application No. PCT/JP2017/004149, filed on Feb. 6, 2017.

(30) Foreign Application Priority Data

Mar. 14, 2016 (JP) ................. 2016-049123

(51) Int. Cl.
*H03H 7/09* (2006.01)
*H03H 7/01* (2006.01)
(Continued)

(52) U.S. Cl.
CPC ........ *H03H 7/0115* (2013.01); *H03H 7/0153* (2013.01); *H03H 7/09* (2013.01);
(Continued)

(58) Field of Classification Search
CPC ......... H03H 7/0115; H03H 2001/0085; H03H 7/175; H03H 7/1775; H03H 7/1791; H03H 7/1766; H03H 7/1758
(Continued)

(56) References Cited

U.S. PATENT DOCUMENTS

| 4,584,544 A | 4/1986 | Hettiger |
| 2012/0049977 A1 | 3/2012 | Chuang |
| 2014/0285286 A1 | 9/2014 | Bojer |
| 2018/0198433 A1 | 7/2018 | Mori |

FOREIGN PATENT DOCUMENTS

| JP | S58-191701 U | 12/1983 |
| JP | S61-212106 A | 9/1986 |

(Continued)

OTHER PUBLICATIONS

International Search Report for International Application No. PCT/JP2017/004149, dated Apr. 25, 2017.
(Continued)

*Primary Examiner* — Rakesh B Patel
(74) *Attorney, Agent, or Firm* — Pearne & Gordon LLP

(57) ABSTRACT

A variable-frequency LC filter that has sharp attenuation characteristics and that does not increase the size of a substrate and a high-frequency frontend module using such a variable-frequency LC filter are provided. A first variable capacitor and a second variable capacitor are disposed on a principal surface such that strength of magnetic field coupling caused between a first inductor and a third inductor is greater than strength of magnetic field coupling caused between a second inductor and the first inductor and than strength of magnetic field coupling caused between the second inductor and the third inductor.

15 Claims, 21 Drawing Sheets

(51) Int. Cl.
  *H03H 7/12* (2006.01)
  *H03H 11/12* (2006.01)
  *H03H 7/075* (2006.01)

(52) U.S. Cl.
  CPC .............. *H03H 7/12* (2013.01); *H03H 7/175* (2013.01); *H03H 7/1758* (2013.01); *H03H 7/1766* (2013.01); *H03H 7/1775* (2013.01); *H03H 7/1791* (2013.01); *H03H 11/1208* (2013.01); *H03H 7/075* (2013.01)

(58) Field of Classification Search
  USPC .................................................. 333/175, 185
  See application file for complete search history.

(56) References Cited

FOREIGN PATENT DOCUMENTS

| | | |
|---|---|---|
| JP | H07-221579 A | 8/1995 |
| JP | 2008-016953 A | 1/2008 |
| JP | 2011-130083 A | 6/2011 |
| JP | 2013-090165 A | 5/2013 |
| WO | 2005/088832 A1 | 9/2005 |
| WO | 2017/043155 A1 | 3/2017 |

OTHER PUBLICATIONS

Written Opinion for International Application No. PCT/JP2017/004149, dated dated Apr. 25, 2017.

FIG. 3A
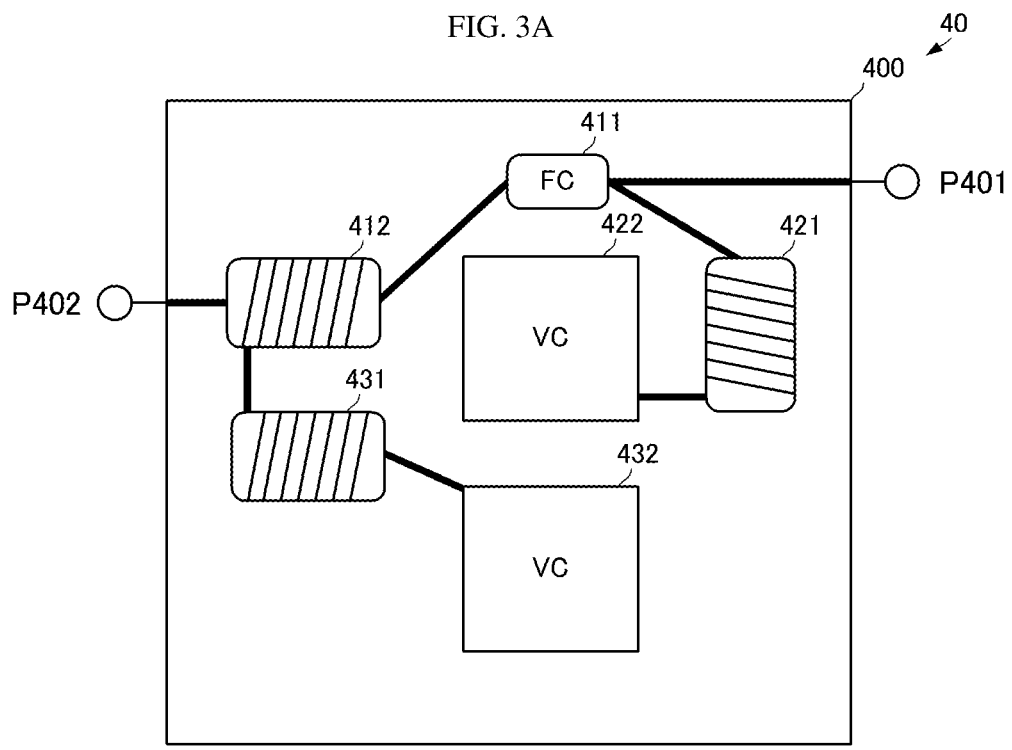
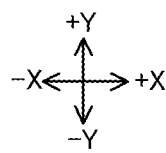
FIG. 3B
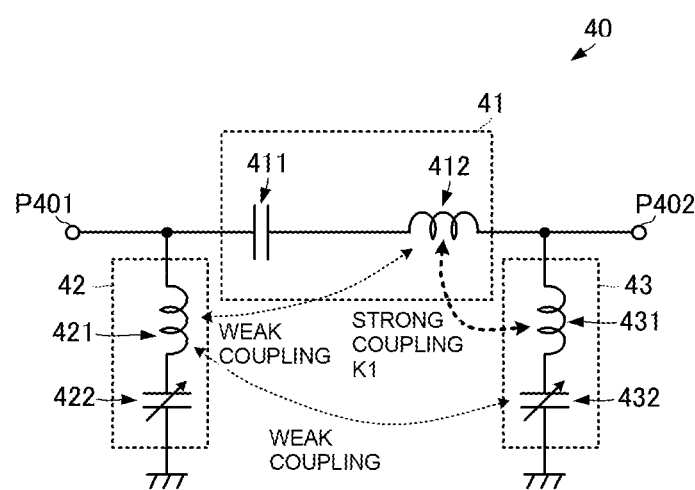

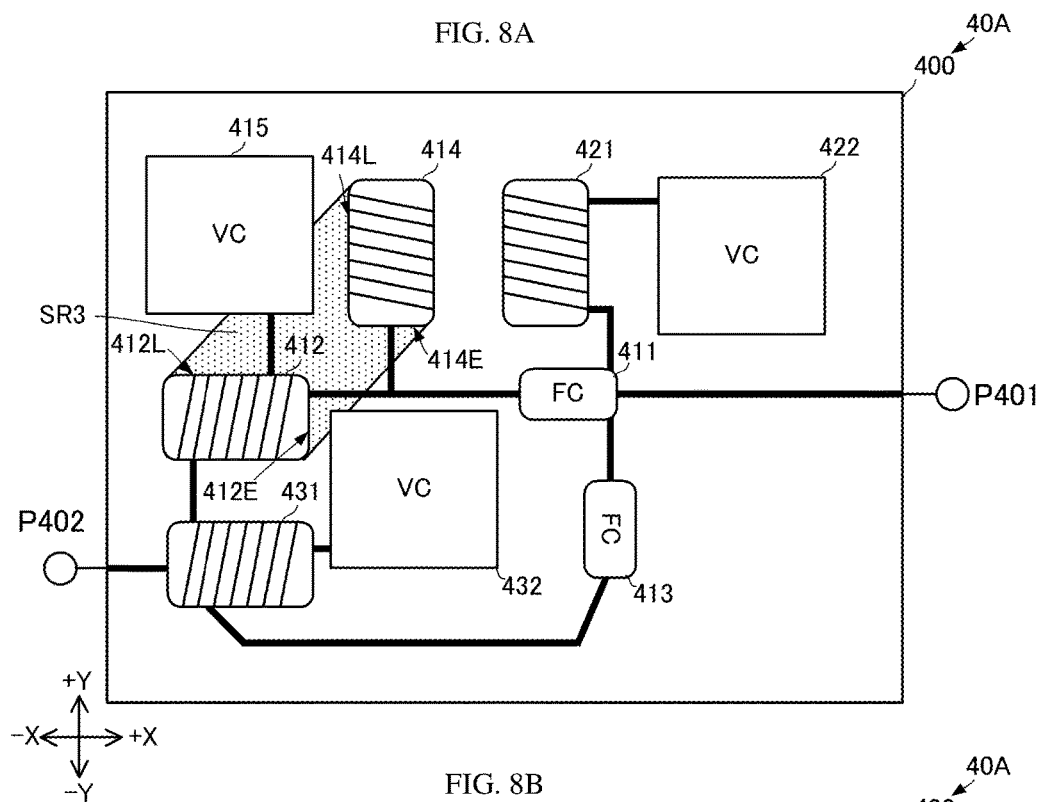
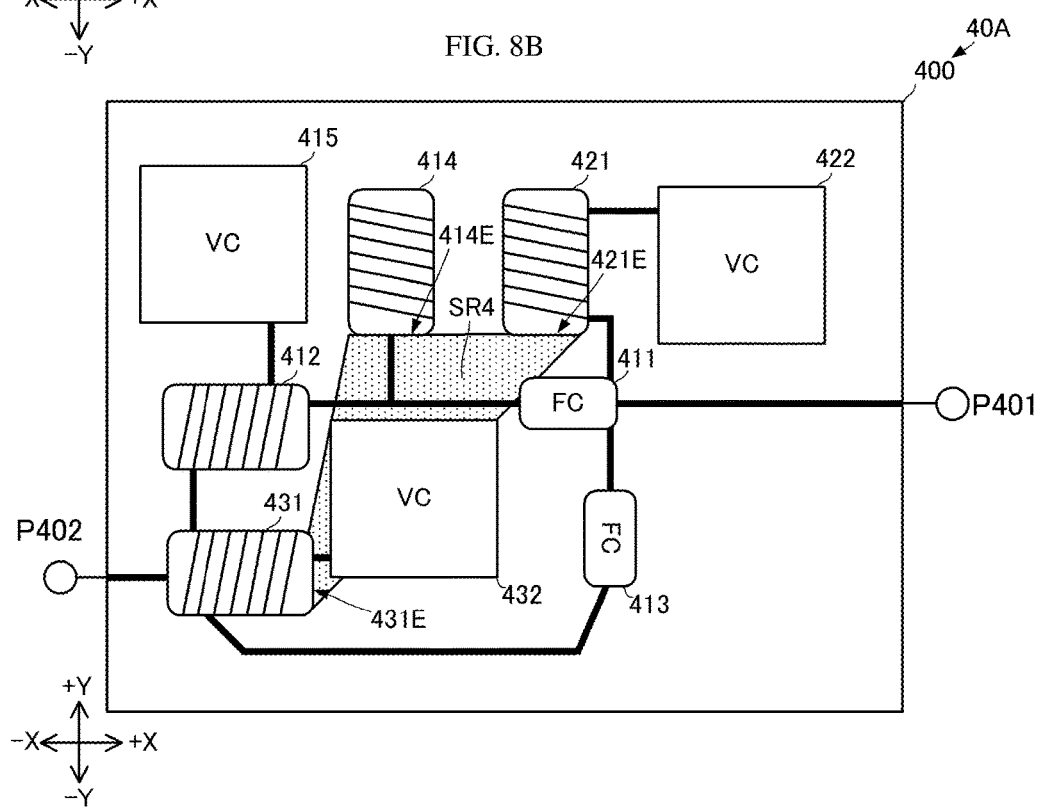

TRANSMISSION CHARACTERISTICS AC3 OF THIRD EMBODIMENT
TRANSMISSION CHARACTERISTICS CAC3 OF THIRD COMPARATIVE EXAMPLE

FIG. 13
FIG. 13A
FOURTH COMPARATIVE EXAMPLE
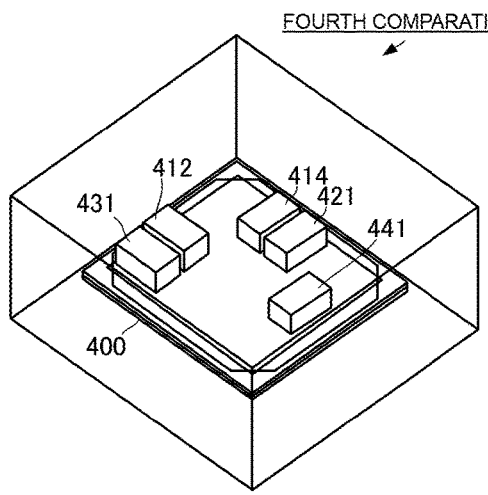
FIG. 13B
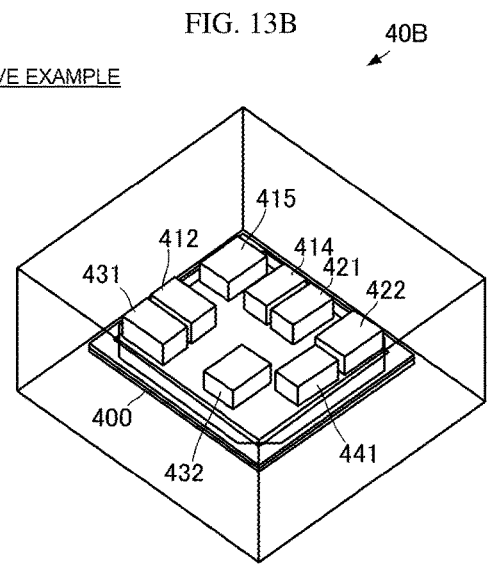
FIG. 13C
FOURTH COMPARATIVE EXAMPLE
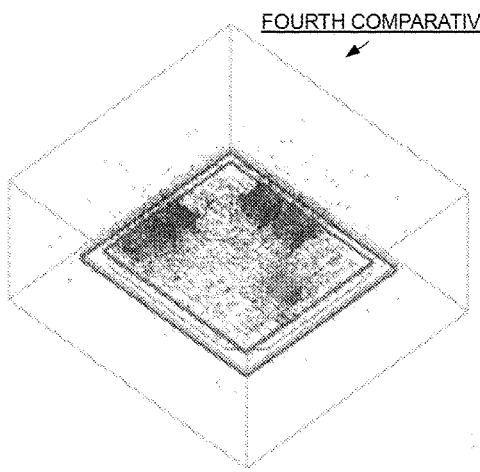
FIG. 13D
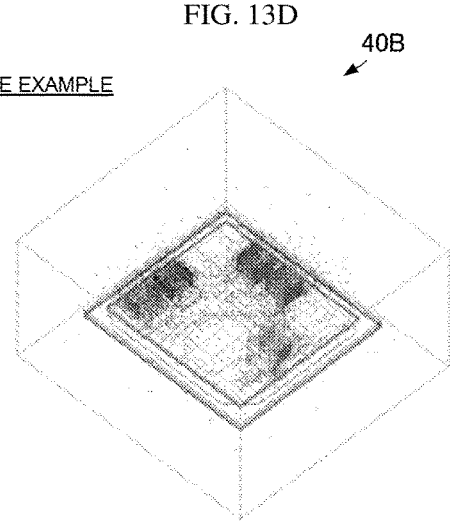

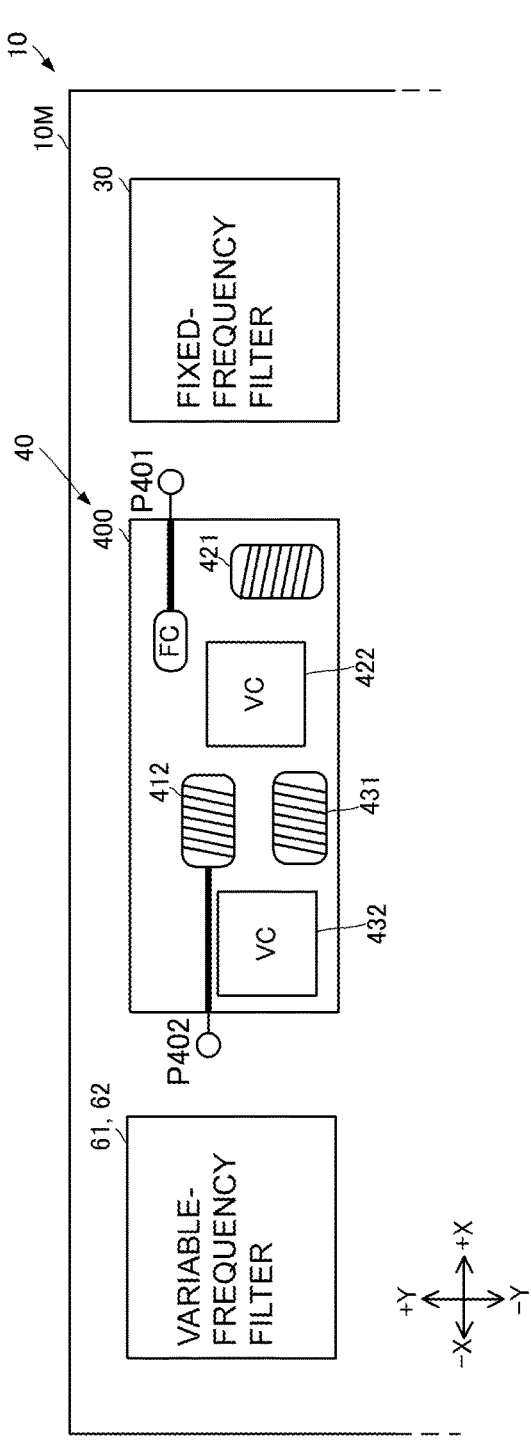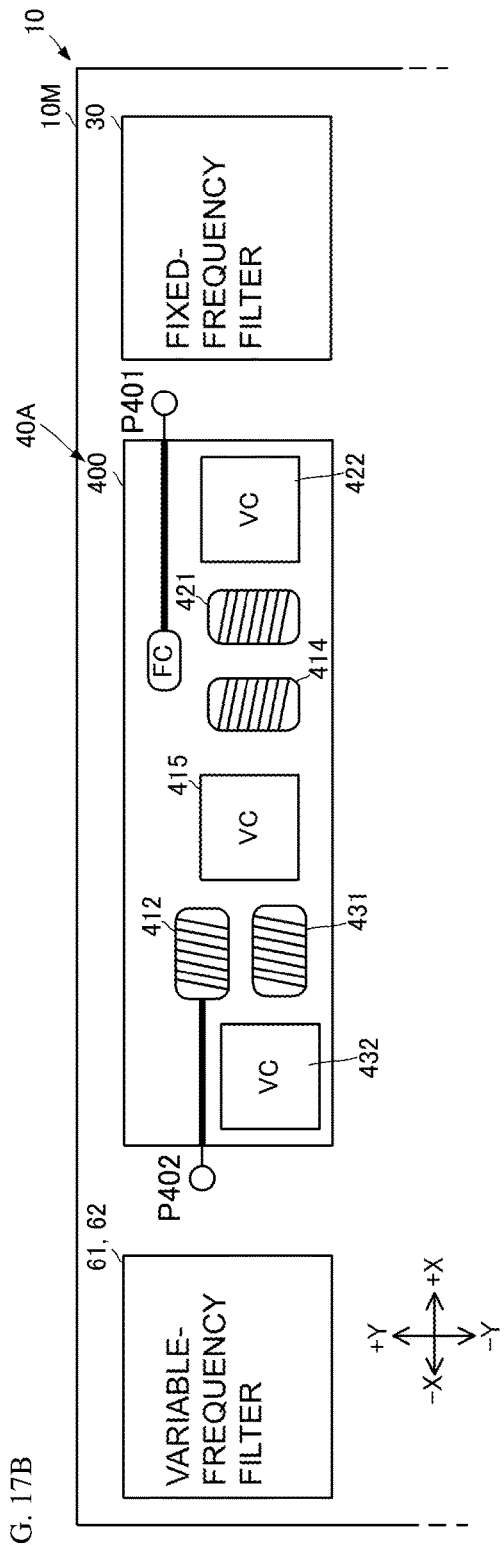
FIG. 17A
FIG. 17B

FIG. 25A
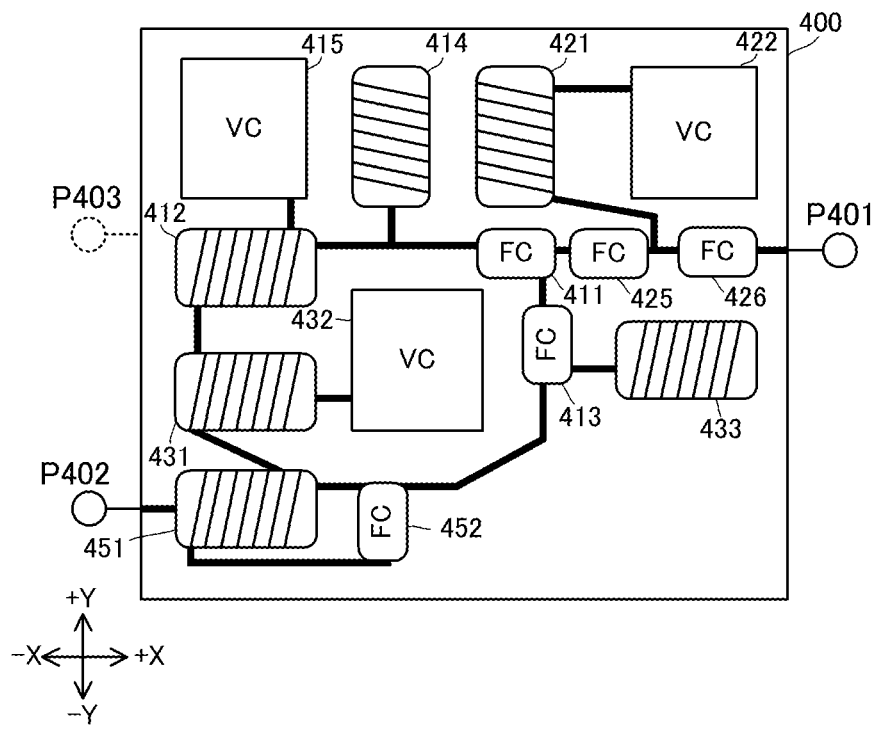
FI.G. 25B
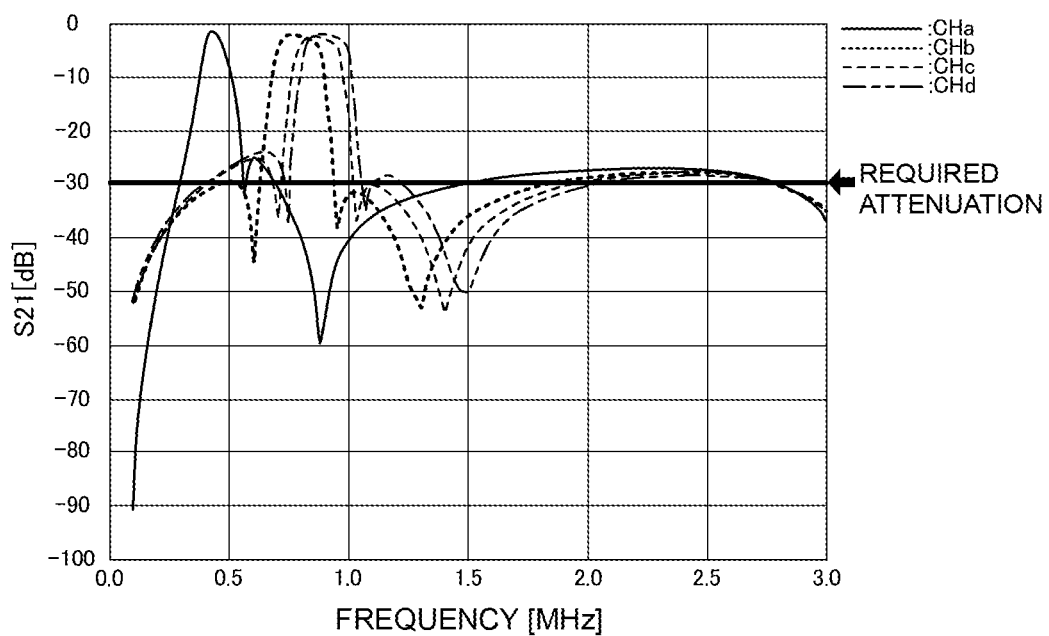

VARIABLE-FREQUENCY LC FILTER, HIGH-FREQUENCY FRONTEND MODULE, AND COMMUNICATION APPARATUS

This is a continuation of International Application No. PCT/JP2017/004149 filed on Feb. 6, 2017 which claims priority from Japanese Patent Application No. 2016-049123 filed on Mar. 14, 2016. The contents of these applications are incorporated herein by reference in their entireties.

BACKGROUND

Technical Field

The present disclosure relates to a variable-frequency LC filter, a high-frequency frontend module, and a communication apparatus that include resonance circuits, each including an inductor and a variable capacitor.

Background Art

Patent Document 1 describes a variable-frequency LC filter using inductors and variable capacitors. The variable-frequency LC filter described in Patent Document 1 includes a first LC parallel circuit, a second LC parallel circuit, a third series circuit, and a fourth series circuit. Each of the first LC parallel circuit and the second LC parallel circuit includes a parallel circuit of an inductor and a variable capacitor. One end of the first LC parallel circuit and one end of the second LC parallel circuit are connected to each other by a coupling inductor, and the other end of the first LC parallel circuit and the other end of the second LC parallel circuit are connected to a ground potential.

The third series circuit includes a variable capacitor. One end of the third series circuit is connected to the first LC parallel circuit, and the other end of the third series circuit is connected to a first connection terminal. The fourth series circuit includes a variable capacitor. One end of the fourth series circuit is connected to the second LC parallel circuit, and the other end of the fourth series circuit is connected to a second connection terminal.

The one end of the first LC parallel circuit (end portion to which the coupling inductor is connected) is connected to the first connection terminal with a third variable capacitor interposed therebetween. The one end of the second LC parallel circuit (end portion to which the coupling inductor is connected) is connected to the second connection terminal with a fourth variable capacitor interposed therebetween. The first connection terminal and the second connection terminal are connected to each other with fixed capacitors interposed therebetween.

With this configuration, bandpass characteristics are changed by changing capacitances of the variable capacitors of the first and second LC parallel circuits and capacitances of the third and fourth variable capacitors.

Such a variable-frequency LC filter is used for wireless communication using a TV white space, for example. The TV white space refers to an unused frequency band in a UHF band allocated for television broadcasting (see Patent Document 2). Recently, wireless communication using this TV white space has been proposed.

The TV white space (unused frequency band) differs from region to region. Thus, it is possible to pass a signal of the TV white space corresponding to a region and to attenuate the other unnecessary signals by changing the pass band of the variable-frequency LC filter described in Patent Document 1. According to the specifications of the TV white space, a single channel has a bandwidth of 6 MHz, for example.

Patent Document 1: International Publication No. 2005/088832
Patent Document 2: Japanese Unexamined Patent Application Publication No. 2013-90165

BRIEF SUMMARY

For example, in the case of allowing a TV white space signal for which a channel in use can change depending on a region to pass using the variable-frequency LC filter described in Patent Document 1, the variable-frequency LC filter needs to have sharp attenuation characteristics because the bandwidth of a single channel of the TV white space is approximately 6 MHz which is quite narrow and a frequency gap between channels is also narrow.

However, magnetic field coupling may be caused between a plurality of inductors in the variable-frequency LC filter described in Patent Document 1. The attenuation characteristics of the variable-frequency LC filter may be influenced by the occurrence of this magnetic field coupling. As a result, the variable-frequency LC filter may fail to have sharp attenuation characteristics. When the variable-frequency LC filter described in Patent Document 1 is used in a wireless communication system in which each channel has a narrow bandwidth and a frequency gap between channels is also narrow as in the TV white space, the variable-frequency LC filter may allow an unnecessary signal to pass therethrough.

On the other hand, it is conceivable to dispose the plurality of inductors to be spaced apart from one another on a substrate in order to hinder unnecessary magnetic field coupling. However, such an arrangement increases the size of the entire substrate.

Accordingly, the present disclosure provides a variable-frequency LC filter that has sharp attenuation characteristics and that does not increase the size of the substrate and a high-frequency frontend module using such a variable-frequency LC filter.

A variable-frequency LC filter according to this disclosure includes an input terminal, an output terminal, a first series arm LC filter circuit, a first parallel arm LC filter circuit, and a second parallel arm LC filter circuit that are mounted on a principal surface of a substrate.

The first series arm LC filter circuit includes a first inductor and is connected between the input terminal and the output terminal. The first parallel arm LC filter circuit includes a second inductor and a first variable capacitor and is connected between a ground potential and a node of the input terminal and the first series arm LC filter. The second parallel arm LC filter circuit includes a third inductor and a second variable capacitor and is connected between a ground potential and a connection node of the output terminal and the first series arm LC filter circuit. The second parallel arm LC filter circuit is directly connected to the first inductor.

In the variable-frequency LC filter according to the present disclosure, the first variable capacitor and the second variable capacitor are disposed on the principal surface such that strength of magnetic field coupling caused between the first inductor and the third inductor is greater than strength of magnetic field coupling caused between the second inductor and the first inductor and than strength of magnetic field coupling caused between the second inductor and the third inductor.

In other words, the first variable capacitor and the second variable capacitor are disposed so as not to hinder magnetic field coupling caused between the first inductor and the third inductor but to hinder magnetic field coupling caused between the second inductor and the first inductor and magnetic field coupling caused between the second inductor and the third inductor. As described above, in the present disclosure, the first and third inductors to be coupled via a magnetic field and the second inductor not to be coupled via a magnetic field are set. Consequently, the frequency of an attenuation pole on a higher frequency side of a pass band approaches the pass band. In addition, attenuation achieved from the frequency of the attenuation pole to the center frequency of the pass band increases. That is, the attenuation characteristics of the variable-frequency LC filter according to the present disclosure become sharper than those of a configuration in which the first variable capacitor and the second variable capacitor are not disposed in the above-described manner.

In addition, the use of this arrangement of the first variable capacitor and the second variable capacitor eliminates the necessity of increasing the size of the substrate and of disposing the second inductor to be spaced apart from the first and third inductors in order to make unnecessary magnetic field coupling less likely to occur. That is, the arrangement of the first variable capacitor and the second variable capacitor according to the present disclosure does not increase the size of the substrate. In addition, since only the arrangement of the variable capacitors is adjusted, another circuit element need not be provided between the second inductor and the first and third inductors.

The above-described characteristic arrangement is implemented in the following manner, for example. The first variable capacitor and the second variable capacitor are located in a region other than a region whose outer perimeter, or border includes the first inductor and the third inductor as a part thereof on the principal surface. A portion of at least one variable capacitor among the first variable capacitor and the second variable capacitor is located in a region whose outer perimeter includes the second inductor and the first inductor or the third inductor as a part thereof on the principle surface. Specifically, the outer perimeter includes an end or lateral face of the first inductor or the third inductor as the part thereof.

In addition, the second inductor and the first and third inductors may be wire-wound inductors disposed on the principal surface such that a winding axis direction of the second inductor is different from winding axis directions of the first and third inductors. This configuration further makes magnetic field coupling less likely to occur between the second inductor and the first and third inductors.

In addition, the variable-frequency LC filter according to this disclosure may have the following configuration. The variable-frequency LC filter further includes a second series arm LC filter circuit connected between the output terminal and the first series arm LC filter circuit. The second series arm LC filter circuit includes a sixth inductor and a fixed capacitor that are connected in parallel to each other between the output terminal and the first series arm LC filter circuit. A portion of the second variable capacitor is located in a region whose outer perimeter includes the second inductor and the sixth inductor as a part thereof and in a region whose outer perimeter includes the third inductor and the sixth inductor as a part thereof on the principal surface.

This configuration suppresses a decrease in attenuation outside the pass band due to unnecessary magnetic field coupling.

The present disclosure is not limited to the variable-frequency LC filter and may be a high-frequency frontend module using the variable-frequency LC filter. Specifically, the high-frequency frontend module according to the present disclosure includes the variable-frequency LC filter described above, a fixed-frequency LC filter connected to the input terminal of the variable-frequency LC filter, and a second variable-frequency filter connected to the output terminal of the variable-frequency LC filter.

A pass band of the fixed-frequency LC filter can include a pass band of the variable-frequency LC filter, and the pass band of the variable-frequency LC filter can include a pass band of the second variable-frequency filter.

That is, a component that has passed through the fixed-frequency LC filter is filtered by the variable-frequency LC filter. Further, the component that has passed through the variable-frequency LC filter is filtered by the second variable-frequency filter.

The high-frequency frontend module according to the present disclosure is used for a TV white space, for example. In this case, the fixed-frequency LC filter sets channels 13 to 65 (470 MHz to 788 MHz) as the pass band thereof. In addition, the pass band of the variable-frequency LC filter is set to pass signals of a band of ten channels from among the channels 13 to 65, for example. Further, the pass band of the second variable-frequency filter is set to pass a signal of a band of one channel from among the ten channels. In this way, the high-frequency frontend module passes a relatively narrow bandwidth of 6 MHz therethrough and attenuates the other bands using transmission characteristics obtained by combining transmission characteristics of the plurality of LC filters.

According to this disclosure, sharper attenuation characteristics can be implemented and an increase in the size of a substrate can be suppressed.

BRIEF DESCRIPTION OF THE SEVERAL VIEWS OF THE DRAWINGS

FIG. 3A is a schematic plan view of a substrate on which the variable-frequency LC filter according to the first embodiment of the present disclosure is mounted, and FIG. 3B is a circuit diagram of the variable-frequency LC filter showing magnetic field coupling caused between inductors.

Each of FIG. 4A

Each of FIG. 8A and FIG. 8B is a schematic plan view of the substrate on which the variable-frequency LC filter according to the second embodiment of the present disclosure is mounted.

FIG. 13A is an external perspective view of the substrate on which the variable-frequency LC filter according to a comparative example is mounted, FIG. 13B is an external perspective view of the substrate on which the variable-frequency LC filter according to the third embodiment of the present disclosure is disposed, FIG. 13C is a diagram illustrating strength of magnetic field coupling caused in the external perspective view illustrated in FIG. 13A, and FIG. 13D is a diagram illustrating strength of magnetic field coupling caused in the external perspective view illustrated in FIG. 13B.

FIG. 17A is a diagram illustrating a substrate arrangement of a high-frequency frontend module including the variable-frequency LC filter according to the first embodiment of the present disclosure, and FIG. 17B is a diagram illustrating a substrate arrangement of a high-frequency frontend module including the variable-frequency LC filter according to the second embodiment of the present disclosure.

Each of FIG. 22A

FIG. 25A is a schematic plan view of a substrate on which a variable-frequency filter according to a sixth comparative example is disposed, and FIG. 25B is a diagram illustrating transmission characteristics of the variable-frequency filter according to the sixth comparative example.

DETAILED DESCRIPTION

Figure 1A:
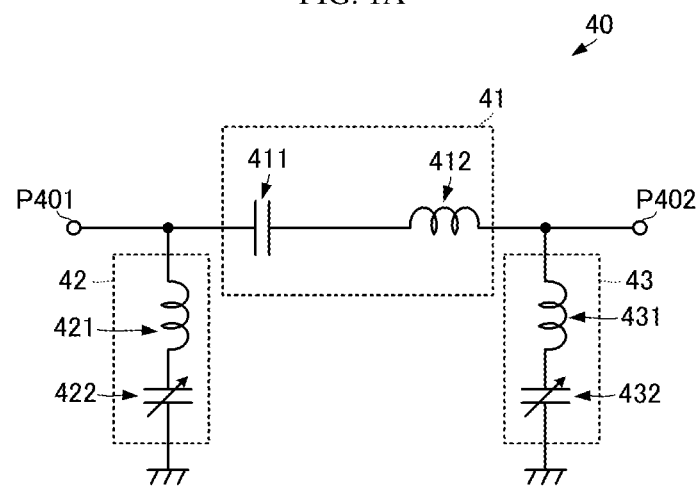
FIG. 1A is a circuit diagram of a variable-frequency LC filter according to a first embodiment of the present disclosure.

A variable-frequency LC filter 40 according to a first embodiment of the present disclosure will be described with reference to the drawings. FIG. 1A is a circuit diagram of the variable-frequency LC filter 40.

The variable-frequency LC filter 40 according to this embodiment has sharper attenuation characteristics in transmission characteristics thereof and prevents an increase in the size of a substrate 400 (see FIG. 3A) as a result of adjusting an arrangement of individual circuit elements on a principal surface of the substrate 400.

The variable-frequency LC filter 40 includes a first series arm LC filter circuit 41, a first parallel arm LC filter circuit 42, a second parallel arm LC filter circuit 43, a first connection terminal P401, and a second connection terminal P402. The first connection terminal P401 corresponds to an input terminal of the present disclosure, and the second connection terminal P402 corresponds to an output terminal of the present disclosure.

The first series arm LC filter circuit 41 is connected between the first connection terminal P401 and the second connection terminal P402. The first parallel arm LC filter circuit 42 is connected between a ground potential and a connection node of the first series arm LC filter circuit 41 and the first connection terminal P401. The second parallel arm LC filter circuit 43 is connected between a ground potential and a connection node of the first series arm LC filter circuit 41 and the second connection terminal P402.

The first series arm LC filter circuit 41 includes a capacitor 411 and an inductor 412. The capacitor 411 has a fixed capacitance.

The capacitor 411 and the inductor 412 are connected in series to each other between the first connection terminal P401 and the second connection terminal P402. In this case, one end of the inductor 412 is directly connected to the second connection terminal P402.

Figure 1B:
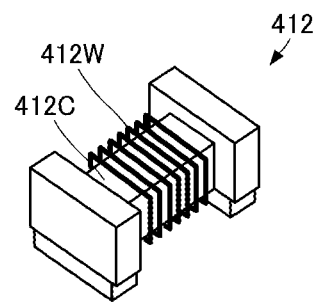
FIG. 1B is an external perspective view of an inductor.

As illustrated in an external perspective view of FIG. 1(B), the inductor 412 is a wire-wound inductor in which a conductor wire 412W is wound around a core 412C extending in a predetermined direction by using the core 412C as an axis. Although not illustrated, inductors 421 and 431 described later are also wire-wound inductors.

A resonant frequency f411 of the first series arm LC filter circuit 41 having such a circuit configuration mainly contributes to a frequency of a pass band of the variable-frequency LC filter 40. The resonant frequency f411 of the series circuit of the capacitor 411 and the inductor 412 is set to a center frequency f0 (600 MH, for example) of the pass band of the variable-frequency LC filter 40 (f411≈f0).

The first parallel arm LC filter circuit 42 includes an inductor 421 and a variable capacitor 422.

A series circuit of the inductor 421 and the variable capacitor 422 is connected between a ground potential and the node of the first series arm LC filter circuit 41 and the first connection terminal P401.

A resonant frequency f42 of the first parallel arm LC filter circuit 42 having such a circuit configuration mainly contributes to a frequency of an attenuation pole on a lower frequency side of the pass band of the variable-frequency LC filter 40. In this case, the resonant frequency f42 is set to be lower than the center frequency f0 (f42<f0).

The second parallel arm LC filter circuit 43 includes an inductor 431 and a variable capacitor 432.

A series circuit of the inductor 431 and the variable capacitor 432 is connected between a ground potential and the node of the first series arm LC filter circuit 41 and the second connection terminal P402.

A resonant frequency f43 of the second parallel arm LC filter circuit 43 having such a circuit configuration mainly contributes to a frequency of an attenuation pole on a higher frequency side of the pass band of the variable-frequency LC filter 40. In this case, the resonant frequency f43 is set to be higher than the center frequency f0 (f43>f0). More specifically, the resonant frequency f43 is set to be higher than the resonant frequency f411 (f43>f411).

A band pass filter having a variable pass band and variable attenuation pole frequencies can be implemented by changing capacitances of the variable capacitors 422 and 432 in such a configuration.

Figure 2:
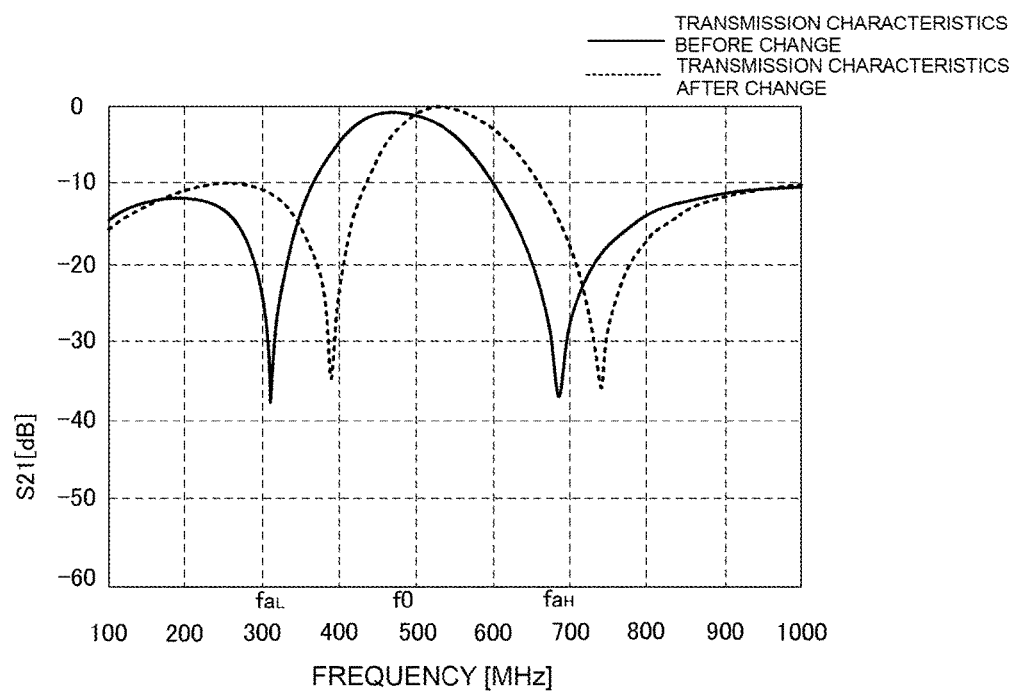
FIG. 2 is a diagram illustrating transmission characteristics of the variable-frequency LC filter according to the first embodiment of the present disclosure.

FIG. 2 is a diagram illustrating transmission characteristics of the variable-frequency LC filter 40 according to the first embodiment of the present disclosure. A solid line denotes transmission characteristics before a change, and a dot line denotes transmission characteristics after the change. As illustrated in FIG. 2, attenuation poles can be formed on the respective sides of the pass band with the bandwidth of the pass band maintained at approximately 100 MHz by using the variable-frequency LC filter 40.

In particular, by directly connecting the inductor 412 of the first series arm LC filter circuit 41 to the second connection terminal P402 without necessarily any capacitor interposed therebetween as illustrated in FIG. 1A, the attenuation characteristics can be made sharp. The attenuation characteristics refer to a rate at which attenuation changes when the frequency is changed from the pass band to the attenuation band. Sharp attenuation characteristics indicate that a change rate of attenuation is large.

In other words, the attenuation characteristics can be made sharper by directly connecting the inductor 412 of the first series arm LC filter circuit 41 to the second connection terminal P402 or by connecting the inductor 412 to the second connection terminal P402 with another inductor interposed therebetween.

The considered reason for this is as follows. The frequency characteristics of a capacitor directly connected to an inductor attenuate low-frequency signals and pass high-frequency signals. That is, since the frequency characteristics of the capacitor resemble the characteristics of a high-pass filter, such frequency characteristics can serve as a factor for degrading attenuation at high frequencies.

In contrast, the frequency characteristics of an inductor directly connected to a connection terminal attenuate high-frequency signals and pass low-frequency signals. That is, since the inductor has characteristics resembling those of a low-pass filter, such frequency characteristics can serve as a factor for improving attenuation at high frequencies.

Further, in the case of connecting an inductor to a connection terminal with another inductor interposed therebetween, the frequency characteristics can serve as a factor for improving attenuation of high-frequency signals.

If magnetic field coupling is caused between a plurality of inductors in a general variable-frequency LC filter, a sub path other than a main path is formed by the magnetic field coupling. The attenuation characteristics of the general variable-frequency LC filter change because of this sub path. Accordingly, in this embodiment, a plurality of inductors to be coupled via a magnetic field and inductors not to be coupled via a magnetic field are set in the following manner to make the attenuation characteristics of the variable-frequency LC filter 40 sharper.

FIG. 3A is a schematic plan view of the substrate 400 on which the variable-frequency LC filter 40 is mounted. Note that illustration of some wires is omitted in FIG. 3A.

As illustrated in FIG. 3A, the inductors 412, 421, and 431, the capacitor 411, and the variable capacitors 422 and 432 are disposed on the principal surface of the substrate 400. More specifically, the inductors 412 and 431 are disposed on a −X side on the principal surface of the substrate 400 when an X direction denotes the directions of the axes of the wound wires (direction in which the core 412C extends). The inductors 412 and 431 are in proximity to each other in a Y direction on the principal surface of the substrate 400 with the directions of the axes of the wound wires thereof being parallel to each other.

The inductor 421 is disposed on a +X side on the principal surface of the substrate 400 when a Y direction denotes the direction of the axis of the wound wire. That is, the direction of the axis of the wound wire of the inductor 421 is perpendicular to the directions of the axes of the wound wires of the inductors 412 and 431.

The variable capacitor 422 is disposed between the inductor 421 and the inductors 412 and 431. The arrangement of the variable capacitor 422 will be described in detail using FIG. 4A and FIG. 4B.

Figure 4A:
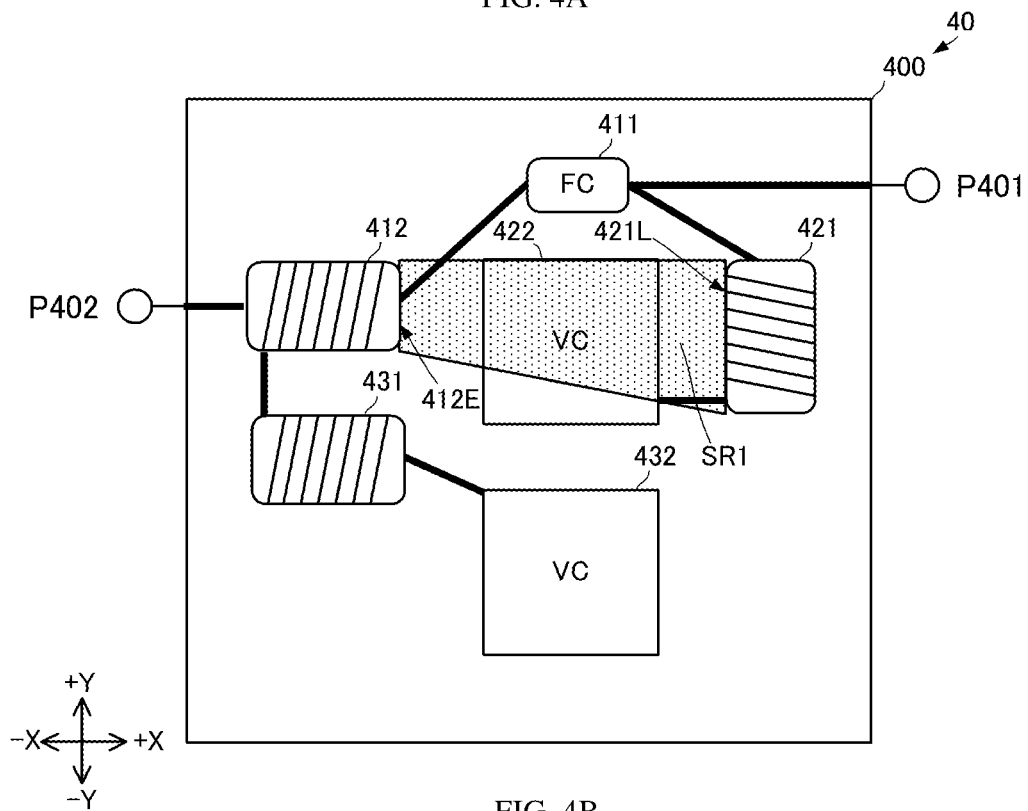
FIG. 4B is a schematic plan view of the substrate on which the variable-frequency LC filter according to the first embodiment of the present disclosure is mounted.

As illustrated in FIG. 4A, a portion of the variable capacitor 422 is located in a region SR1 defined by an outer perimeter that includes a side of the inductor 412 and a side of the inductor 421 in plan view of the substrate 400. This region SR1 is a region obtained by viewing in plan a space having, as lateral faces thereof, an end face 412E of the inductor 412 in the wound-wire axis direction and a lateral face 421L of the inductor 421 (face perpendicular to the end face and to the principal surface of the substrate 400).

Figure 4B:
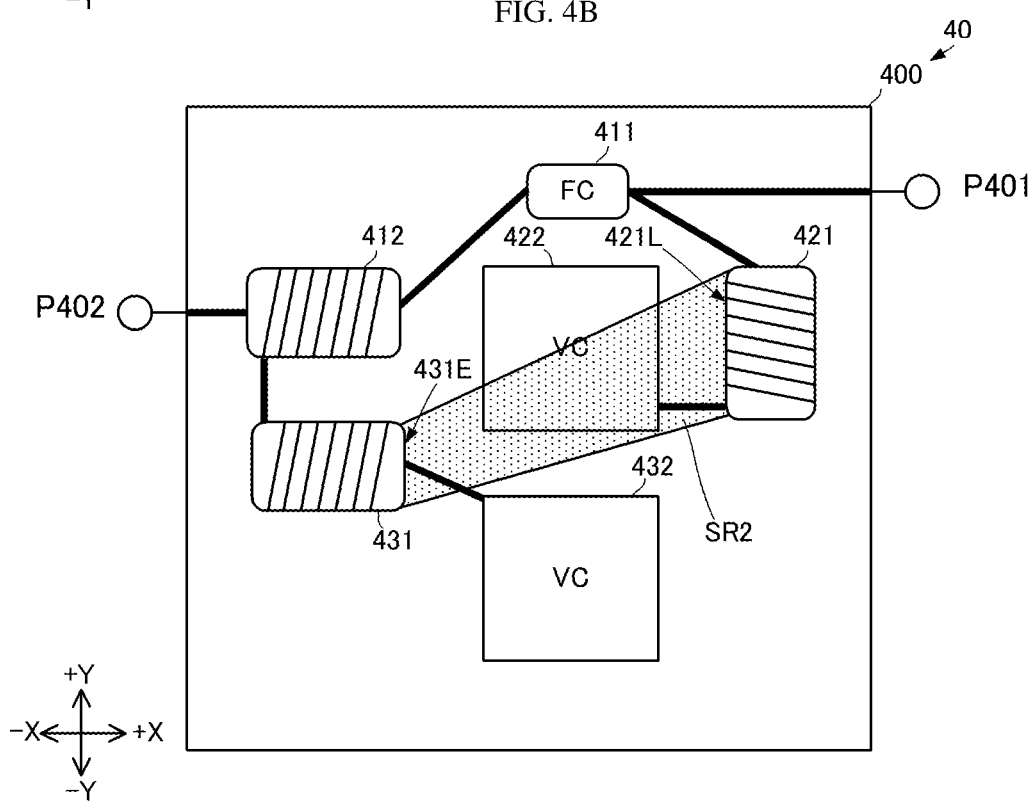

As illustrated in FIG. 4B, a portion of the variable capacitor 422 is located in a region SR2 defined by an outer perimeter that includes a side of the inductor 431 and a side of the inductor 421. This region SR2 is a region obtained by viewing in plan a space having, as lateral faces thereof, an end face 431E of the inductor 431 in the wound-wire axis direction and the lateral face 421L of the inductor 421.

No element is disposed between the inductor 412 and the inductor 431. The variable capacitors 422 and 432 are disposed in a region other than the region defined by the outer perimeter that includes sides of the inductors 412 and 431.

As described above, the wound-wire axis directions of the inductors 412, 431, and 421 and the arrangements of the variable capacitors 422 and 432 relative to the individual inductors are adjusted. Consequently, the occurrence of magnetic field coupling is suppressed between the inductor 421 and the inductor 412. Strength of magnetic field coupling K1 (see FIG. 3B) caused between the inductor 412 and the inductor 431 directly connected to the inductor 412 in the second parallel arm LC filter circuit 43 is much greater than strength of magnetic field coupling caused between the inductor 421 and the inductor 412. Likewise, the occurrence of magnetic field coupling is suppressed between the inductor 421 and the inductor 431. Thus, the strength of the magnetic field coupling K1 caused between the inductor 412 and the inductor 431 is much greater than strength of magnetic field coupling caused between the inductor 421 and the inductor 431.

Figure 5A:
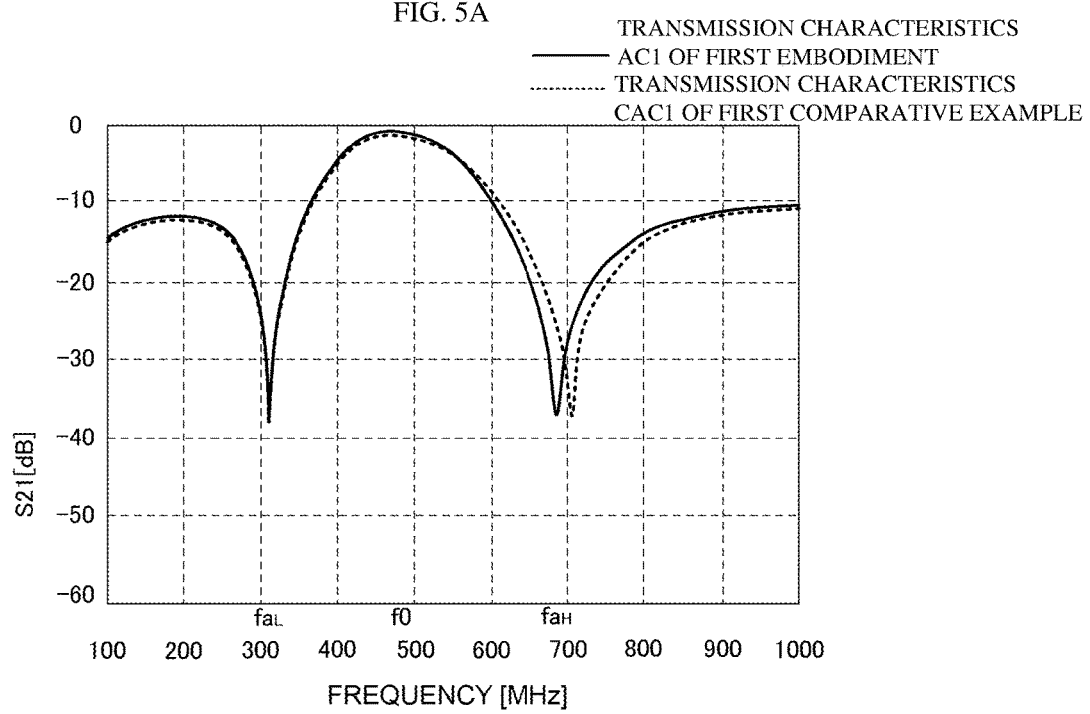
FIG. 5A is a diagram illustrating transmission characteristics of the variable-frequency LC filter according to the first embodiment of the present disclosure and transmission characteristics of a variable-frequency LC filter according to a comparative example.
Figure 5B:
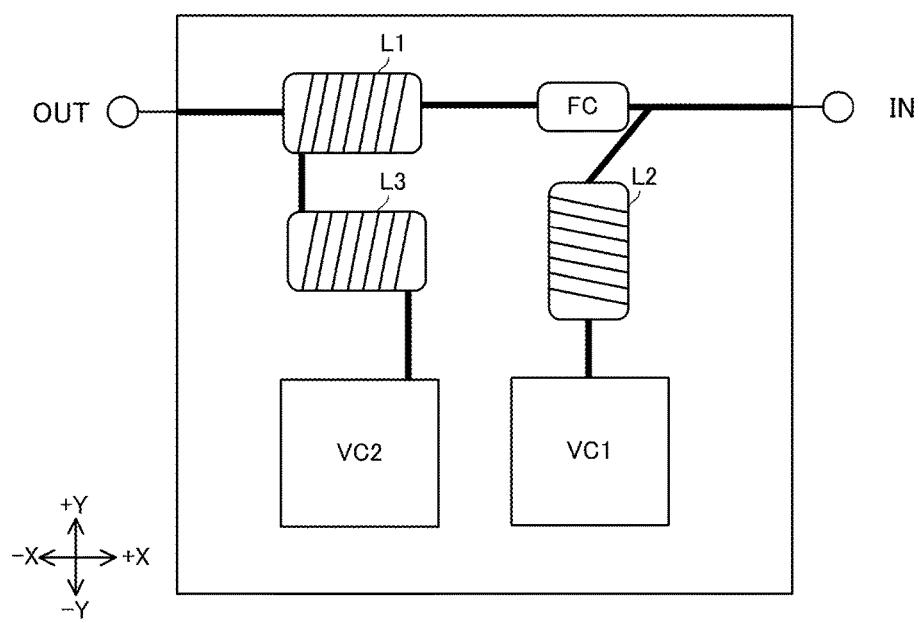
FIG. 5B is a schematic plan view of a substrate on which the variable-frequency LC filter according to the comparative example is mounted.

The variable-frequency LC filter 40 according to this embodiment implements sharper attenuation characteristics by setting a plurality of inductors to be coupled via a magnetic field and inductors not to be coupled via a magnetic field. The attenuation characteristics will be described using FIG. 5A and FIG. 5B. FIG. 5A is a diagram illustrating transmission characteristics AC1 of the variable-frequency LC filter 40 and transmission characteristics CAC1 of a variable-frequency LC filter according to a first comparative example. A solid line denotes the transmission characteristics AC1, and a dot line denotes the transmission characteristics CAC1. FIG. 5B is a schematic plan view of a substrate on which the variable-frequency LC filter according to the first comparative example is mounted. Note that in the variable-frequency LC filter according to the first comparative example, an inductor L1 is equivalent to the inductor 412, an inductor L3 is equivalent to the inductor 431, an inductor L2 is equivalent to the inductor 421, a variable capacitor VC1 is equivalent to the variable capacitor 422, and a variable capacitor VC2 is equivalent to the variable capacitor 432.

In the variable-frequency LC filter according to the first comparative example, no circuit elements (including the variable capacitors VC1 and VC2) are disposed in a region defined by an outer perimeter that includes a side of the inductor L2 and a side of the inductor L1 as illustrated in FIG. 5B. In addition, no circuit elements are disposed in a region defined by an outer perimeter that includes a side of the inductor L3 and a side of the inductor L2. Thus, the inductor L2 is more likely to cause magnetic field coupling with the inductors L1 and L3. In the first comparative example, the occurrence of this unnecessary magnetic field coupling makes the attenuation characteristics of the transmission characteristics gradual.

As illustrated in the characteristics diagram of FIG. 5A, a frequency faH of an attenuation pole on a higher frequency side of the pass band in the transmission characteristics AC1 of the variable-frequency LC filter 40 according to this embodiment is closer to the center frequency f0 of the pass band than that in the transmission characteristics CAC1 of the variable-frequency LC filter according to the first comparative example. In addition, attenuation (dB) in the attenuation band of the transmission characteristics AC1 is greater from the center frequency f0 to the frequency faH than attenuation in the same attenuation band of the transmission characteristics CAC1. That is, the attenuation characteristics of the transmission characteristics AC1 of the variable-frequency LC filter 40 according to this embodiment are sharper than the attenuation characteristics of the transmission characteristics CAC1 according to the first comparative example on the higher frequency side of the pass band.

In addition, it is not necessary to increase the size of the principal surface of the substrate 400 to dispose the inductor 421 to be spaced apart from the other inductors 412 and 431 in order to prevent unnecessary magnetic field coupling of the inductor 421 in the variable-frequency LC filter 40. The variable-frequency LC filter 40 prevents the unnecessary magnetic field coupling by simply adjusting the arrangement of the variable capacitor 422 without necessarily increasing the size of the substrate 400.

In addition, the use of the configuration of the variable-frequency LC filter 40 eliminates the necessity of disposing another dedicated circuit element to prevent unnecessary magnetic field coupling. Thus, the variable-frequency LC filter 40 can also prevent a bandpass loss caused as a result of disposing another circuit element.

As described above, the variable-frequency LC filter 40 according to this embodiment can prevent an increase in the size of the substrate 400 while implementing sharper attenuation characteristics.

In addition, as illustrated in FIG. 3A, the variable capacitor 422 is disposed between a path that passes sequentially through the variable capacitor 422, the inductor 421, and the capacitor 411 and a path that passes sequentially through the capacitor 411, the inductor 412, the inductor 431, and the variable capacitor 432. This arrangement of the variable capacitor 422 makes electromagnetic field coupling less likely to occur between the path that passes sequentially through the variable capacitor 422, the inductor 421, and the capacitor 411 and the path that passes sequentially through the capacitor 411, the inductor 412, the inductor 431, and the variable capacitor 432. Thus, the variable-frequency LC filter 40 according to this embodiment can make the attenuation characteristics sharper also by preventing unnecessary electromagnetic field coupling between the paths.

Although not illustrated, the variable-frequency LC filter 40 can provide substantially the same advantage even if the arranged positions of the variable capacitor 422 and the variable capacitor 432 are switched. In addition, the configuration for setting the wound-wire axis direction of the inductor 421 to be different from the wound-wire axis directions of the other inductors 412 and 431 is not necessary to the present disclosure.

Figure 6:
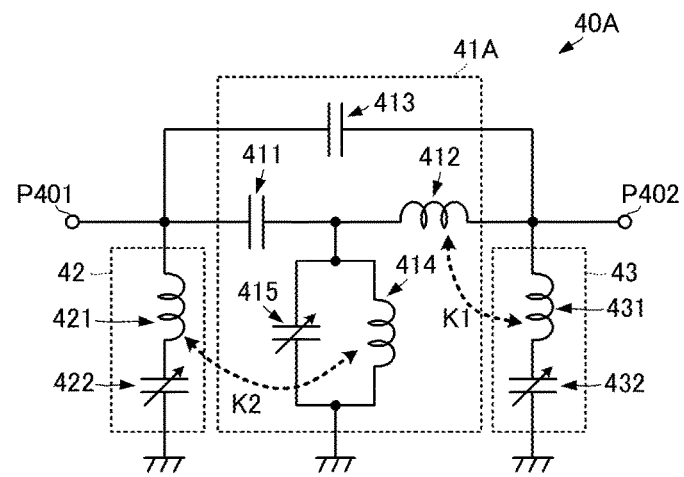
FIG. 6 is a circuit diagram of a variable-frequency LC filter according to a second embodiment of the present disclosure.
Figure 7:
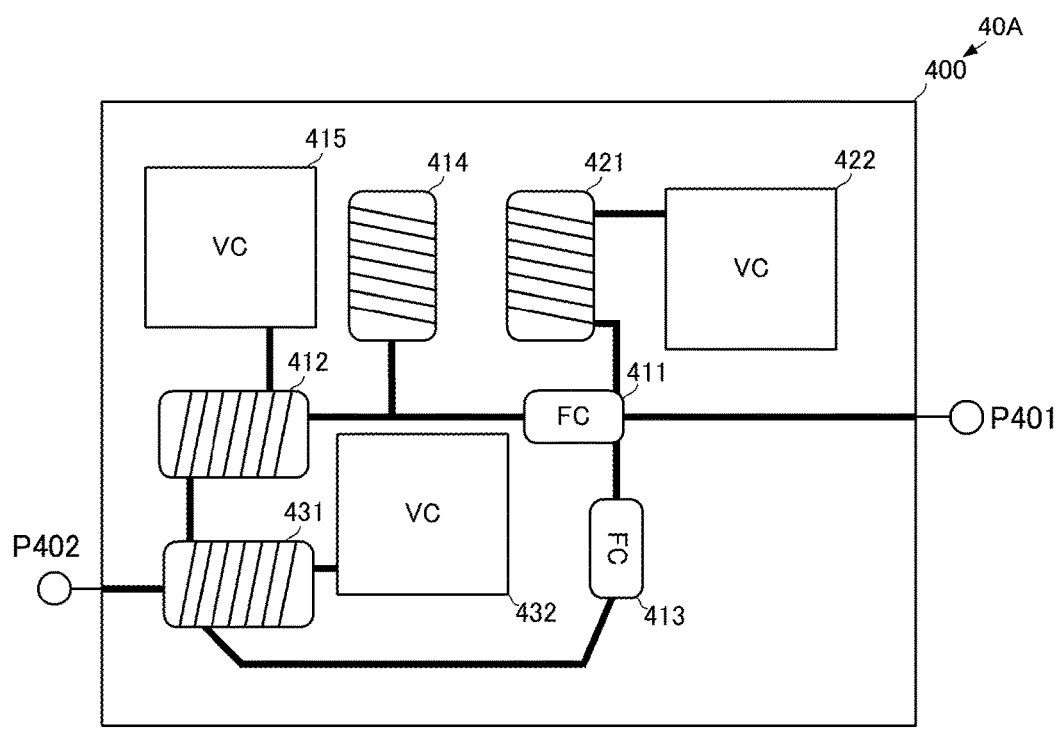
FIG. 7 is a schematic plan view of a substrate on which the variable-frequency LC filter according to the second embodiment of the present disclosure is mounted.

A variable-frequency LC filter 40A according to a second embodiment will be described next. FIG. 6 is a circuit diagram of the variable-frequency LC filter 40A. FIG. 7 is a schematic plan view of the substrate 400 on which the variable-frequency LC filter 40A is mounted.

The variable-frequency LC filter 40A according to this embodiment differs from the variable-frequency LC filter 40 according to the first embodiment in that the variable-frequency LC filter 40A includes a first series arm LC filter circuit 41A in place of the first series arm LC filter circuit 41. A description regarding the same configuration will be omitted.

As illustrated in FIG. 6, the first series arm LC filter circuit 41A additionally includes a capacitor 413, an inductor 414, and a variable capacitor 415 compared with the first series arm LC filter circuit 41.

The capacitor 413 has one end connected to the first connection terminal P401 and another end connected to the second connection terminal P402. Consequently, the capacitor 413 is connected in parallel to an LC series arm filter circuit of the capacitor 411 and the inductor 412. A resonant frequency f412 of the parallel circuit of the capacitor 413 and the inductor 412 is set to be higher than the center frequency f0 (f412>f0).

The inductor 414 and the variable capacitor 415 are connected in parallel to each other. This parallel circuit is connected between a ground potential and a connection node of the capacitor 411 and the inductor 412. A resonant frequency f413 of this parallel circuit is set to be lower than the center frequency f0 (f413<f0).

As illustrated in FIG. 7, the inductors 412 and 431 are disposed on the −X side in proximity to each other in the Y direction on the principal surface of the substrate 400 when the X direction denotes the wound-wire axis directions.

As illustrated in FIG. 7, the inductors 414 and 421 are disposed on a +Y side substantially at the center in the X direction on the principle surface of the substrate 400 when the Y direction denotes the wound-wire axis directions. The variable capacitor 415 is disposed on the +Y side and on the −X side of the substrate 400. The variable capacitor 432 is disposed on the −Y side substantially at the center in the X direction on the principal surface of the substrate 400. No circuit element is disposed between the inductors 414 and 421.

More specifically, as illustrated in the schematic plan view of FIG. 8A, a portion of the variable capacitor 415 is disposed in a region SR3 defined by an outer perimeter that includes a side of the inductor 412 and a side of the inductor 414. This region SR3 is a region obtained by viewing in plan a space having, as lateral faces thereof, lateral faces 412L and 414L of the inductors 412 and 414 and the end faces 412E and 414E of the inductors 412 and 414. Likewise, a portion of the variable capacitor 432 is also disposed in the region SR3.

As illustrated in the schematic plan view of FIG. 8B, a portion of the variable capacitor 432 is located in a region SR4 defined by an outer perimeter that includes a side of the inductor 431, a side of the inductor 414, and a side of the inductor 421. This region SR4 is a region obtained by viewing in plan a space having, as lateral faces thereof, the end faces 414E and 421E of the inductors 414 and 421 and the end face 431E of the inductor 431.

The above-described arrangement suppresses the occurrence of magnetic field coupling between the inductor 412 and the inductor 414. In addition, the occurrence of magnetic field coupling is also suppressed between the inductor 431 and the inductors 414 and 421. As a result, strength of magnetic field coupling K1 caused between the inductor 412 and the inductor 431 directly connected to the inductor 412 in the second parallel arm LC filter circuit 43 is greater than strength of magnetic field coupling caused between the inductor 412 and the inductor 414 and than strength of magnetic field coupling caused between the inductor 412 and the inductor 421. The strength of the magnetic field coupling K1 is also greater than strength of magnetic field coupling caused between the inductor 431 and the inductor 414 and between the inductor 431 and the inductor 421. In addition, strength of magnetic field coupling K2 (see FIG. 6) caused between the inductor 414 and the inductor 421 is greater than strength of magnetic field coupling caused between the inductor 414 and the inductor 412 and between the inductor 414 and the inductor 431. The strength of the magnetic field coupling K2 is also greater than strength of magnetic field coupling caused between the inductor 421 and the inductor 412 and between the inductor 421 and the inductor 431. With this configuration, the variable-frequency LC filter 40A according to this embodiment implements sharper attenuation characteristics without necessarily increasing the size of the substrate 400.

Figure 9A:
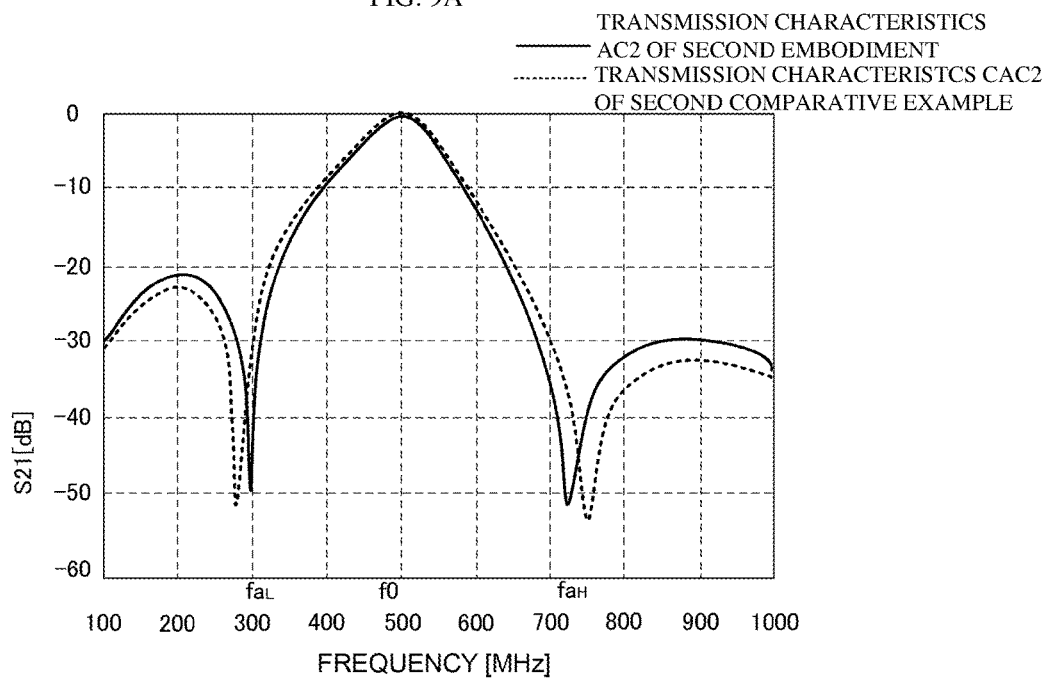
FIG. 9A is a diagram illustrating transmission characteristics of the variable-frequency LC filter according to the second embodiment of the present disclosure and transmission characteristics of a variable-frequency LC filter according to a comparative example.
Figure 9B:
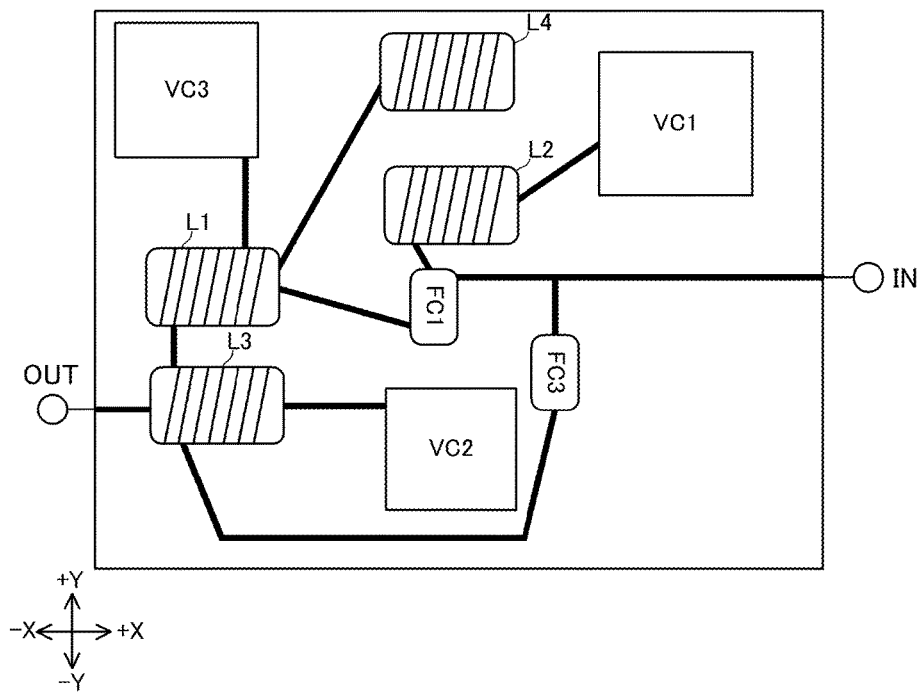
FIG. 9B is a schematic plan view of a substrate on which the variable-frequency LC filter according to the comparative example is mounted.

FIG. 9A is a diagram illustrating transmission characteristics AC2 of the variable-frequency LC filter 40A and transmission characteristics CAC2 of a variable-frequency LC filter according to a second comparative example. A solid line denotes the transmission characteristics AC2, and a dot line denotes the transmission characteristics CAC2. FIG. 9B is a schematic plan view of a substrate on which the variable-frequency LC filter according to the second comparative example is mounted. In the variable-frequency LC filter according to the second comparative example, an inductor L4 is equivalent to the inductor 414, and a variable capacitor VC3 is equivalent to the variable capacitor 415.

As illustrated in FIG. 9B, the wound-wire axis directions of the inductors L2 and L4 are the X direction in the variable-frequency LC filter according to the second comparative example. The variable capacitors VC2 and VC3 are disposed in a region other than a region defined by an outer perimeter that includes a side of the inductor L1 and a side of the inductor L4. The variable capacitor VC2 is disposed in a region other than a region defined by an outer perimeter that includes a side of the inductor L3 and a side of the inductors L2 and L4. Consequently, magnetic field coupling is caused between the inductor L4 and the inductor L1 and between the inductor L4 and the inductor L3 in the variable-frequency LC filter according to the second comparative example.

As illustrated in the characteristics diagram of FIG. 9A, a frequency faL of an attenuation pole on a lower frequency side in the transmission characteristics AC2 is closer to the center frequency f0 than that of the transmission characteristics CAC2 according to the second comparative example. In addition, attenuation (dB) in the transmission characteristics AC2 is greater than attenuation in the transmission characteristics CAC2 from the frequency faL to the center frequency f0. A frequency faH of an attenuation pole on a higher frequency side in the transmission characteristics AC2 is closer to the center frequency f0 than that of the transmission characteristics CAC2 according to the second comparative example. In addition, attenuation (dB) in the transmission characteristics AC2 is greater than attenuation in the transmission characteristics CAC2 from the center frequency f0 to the frequency faH. That is, the attenuation characteristics of the transmission characteristics AC2 are sharper than the attenuation characteristics of the transmission characteristics CAC2.

In addition, a path that passes through the inductor 431 is less likely to cause electromagnetic field coupling with a path that passes through the inductor 414 because of the variable capacitor 415 disposed between the paths. Further, the path that passes through the inductor 431 is less likely to cause electromagnetic field coupling with paths that pass through the inductors 414 and 421 because of the variable capacitor 432 disposed between the paths. Consequently, the variable-frequency LC filter 40A implements sharper attenuation characteristics.

Figure 10:
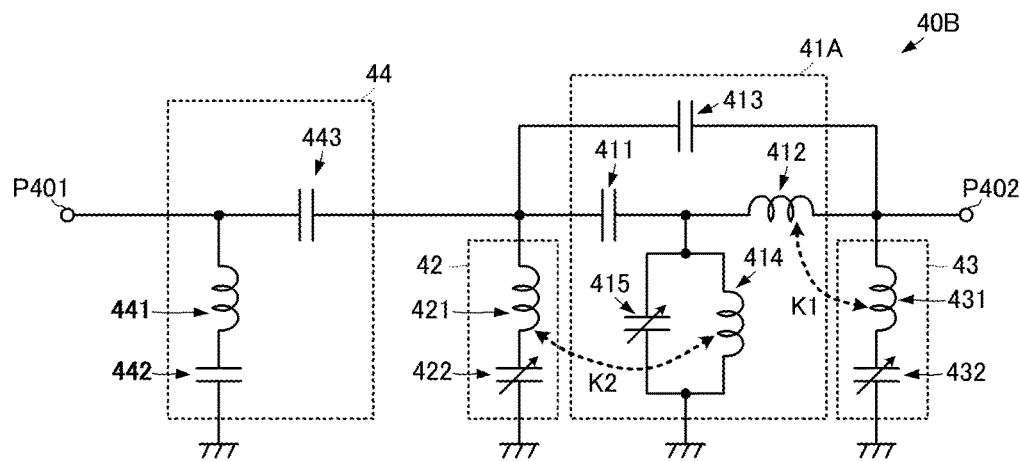
FIG. 10 is a circuit diagram of a variable-frequency LC filter according to a third embodiment of the present disclosure.
Figure 11:
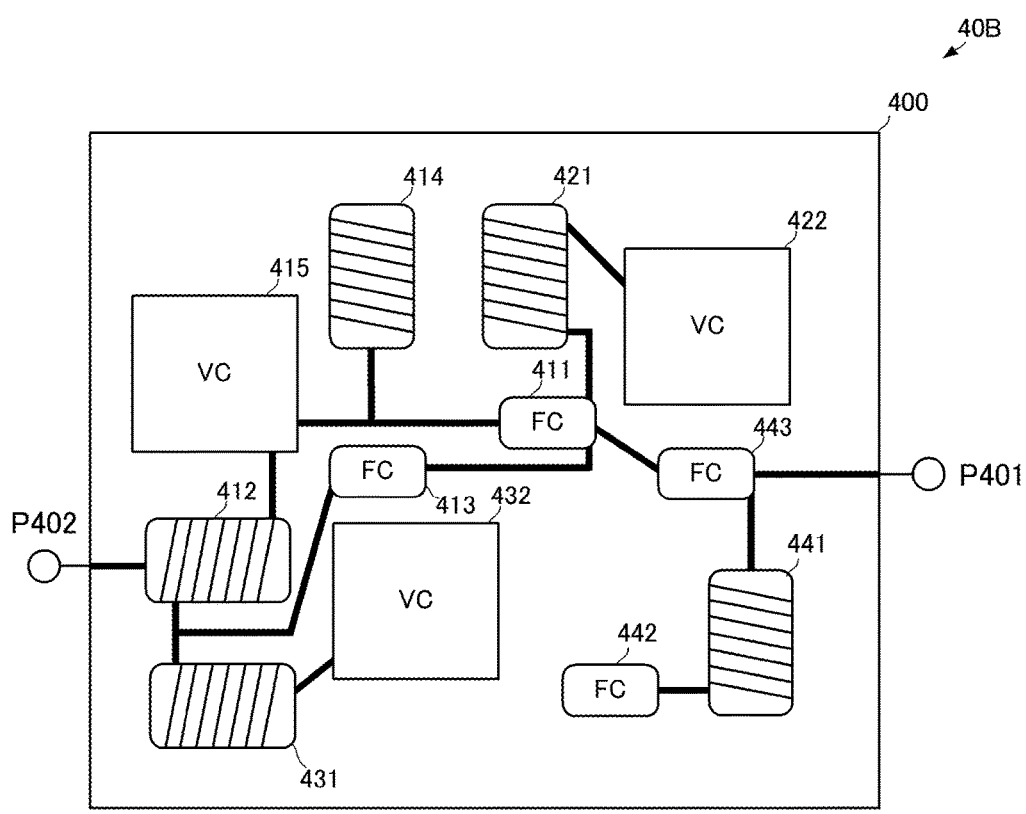
FIG. 11 is a schematic plan view of a substrate on which the variable-frequency LC filter according to the third embodiment of the present disclosure is mounted.

A variable-frequency LC filter 40B according to a third embodiment will be described next with reference to the drawings. FIG. 10 is a circuit diagram of the variable-frequency LC filter 40B. FIG. 11 is a schematic plan view of the substrate 400 on which the variable-frequency LC filter 40B is mounted.

The variable-frequency LC filter 40B according to this embodiment additionally includes an LC filter circuit 44 compared with the variable-frequency LC filter 40A. The LC filter circuit 44 includes a capacitor 443 having a fixed capacitance. The capacitor 443 is connected between the first connection terminal P401 and the first series arm LC filter circuit 41A. The LC filter circuit 44 further includes an inductor 441 and a capacitor 442 that are connected in series to each other. This series circuit is connected between a ground potential and a connection node of the first connection terminal P401 and the capacitor 443. The value of each element of the LC filter circuit 44 is set to improve the attenuation characteristics on a lower frequency side of the pass band of the variable-frequency LC filter 40B.

As illustrated in FIG. 11, the inductors 412 and 431 are disposed on the −X side and the −Y side on the principal surface of the substrate 400 when the X direction denotes the wound-wire axis directions. The inductors 412 and 431 are disposed in proximity to each other in the Y direction. The inductors 414 and 421 are disposed substantially at the center in the X direction on the +Y side on the principal surface of the substrate 400 when the Y direction denotes the wound-wire axis directions. The inductors 414 and 421 are disposed in proximity to each other in the X direction.

As illustrated in FIG. 11, the inductor 441 is disposed on the +X side and the −Y side on the principal surface of the substrate 400 when the Y direction denotes the wound-wire axis direction. A portion of the variable capacitor 422 is located in a region defined by an outer perimeter that includes a side of the inductor 421 and a side of the inductor 441. A portion of the variable capacitor 432 is located in a region defined by an outer perimeter that includes a side of the inductor 441 and a side of the inductor 431. With such a configuration, the occurrence of magnetic field coupling is suppressed between the inductor 441 and the inductor 421 and between the inductor 441 and the inductor 431. As a result, strength of magnetic field coupling K1 caused between the inductor 412 and the inductor 431 directly connected to the inductor 412 in the second parallel arm LC filter circuit 43 is greater than strength of magnetic field coupling caused between the inductor 412 and the inductor 414, than strength of magnetic field coupling caused between the inductor 412 and the inductor 421, and than strength of magnetic field coupling caused between the inductor 412 and the inductor 441. The strength of the magnetic field coupling K1 is also greater than strength of magnetic field coupling caused between the inductor 431 and the inductor 414, than strength of magnetic field coupling caused between the inductor 431 and the inductor 421, and than strength of magnetic field coupling caused between the inductor 431 and the inductor 441. In addition, strength of magnetic field coupling K2 (see FIG. 10) caused between the inductor 414 and the inductor 421 is greater than strength of magnetic field coupling caused between the inductor 414 and the inductor 412, than strength of magnetic field coupling caused between the inductor 414 and the inductor 431, and than strength of magnetic field coupling caused between the inductor 414 and the inductor 441. The strength of the magnetic field coupling K2 is also greater than strength of magnetic field coupling caused between the inductor 421 and the inductor 412, than strength of magnetic field coupling caused between the inductor 421 and the inductor 431, and than strength of magnetic field coupling caused between the inductor 421 and the inductor 441. With such a configuration, the variable-frequency LC filter 40B according to this embodiment implements sharper attenuation characteristics without necessarily increasing the size of the substrate 400.

Figure 12A:
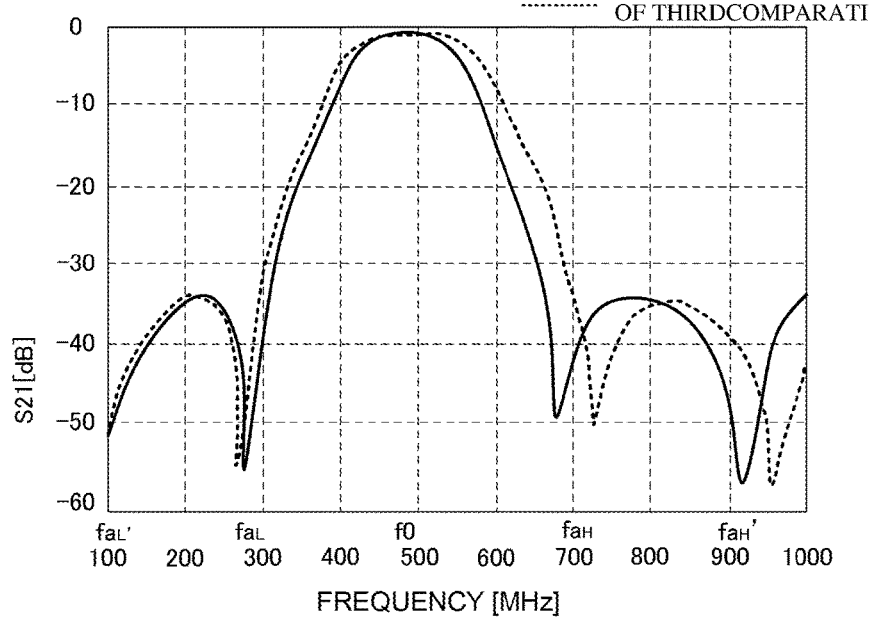
FIG. 12A is a diagram illustrating transmission characteristics of the variable-frequency LC filter according to the third embodiment of the present disclosure and transmission characteristics of a variable-frequency LC filter according to a comparative example.
Figure 12B:
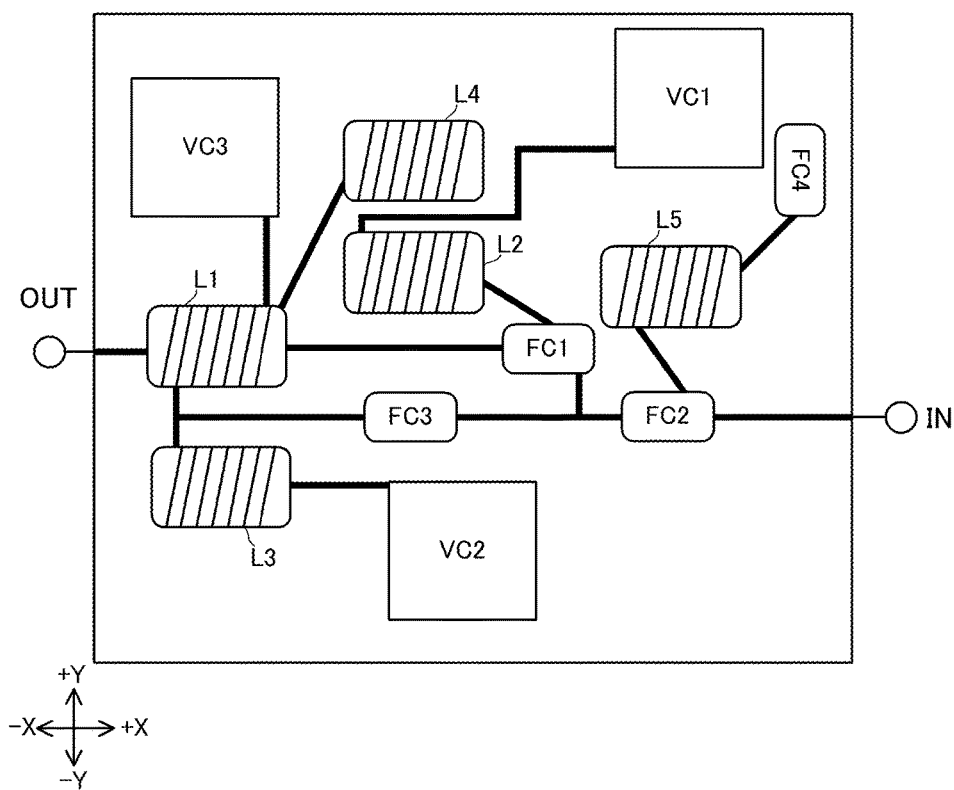
FIG. 12B is a schematic plan view of a substrate on which the variable-frequency LC filter according to the comparative example is mounted.

FIG. 12A is a diagram illustrating transmission characteristics AC3 of the variable-frequency LC filter 40B and transmission characteristics CAC3 of a variable-frequency LC filter according to a third comparative example. A solid line denotes the transmission characteristics AC3, and a dot line denotes the transmission characteristics CAC3. FIG. 12B is a schematic plan view of a substrate on which the variable-frequency LC filter according to the third comparative example is mounted. In the variable-frequency LC filter according to the third comparative example, an inductor L5 is equivalent to the inductor 441.

As illustrated in FIG. 12B, the wire-wound axis direction of the inductor L5 is the X direction in the variable-frequency LC filter according to the third comparative example. The variable capacitor VC1 is disposed in a region other than a region defined by an outer perimeter that includes a side of the inductor L5 and a side of the inductor L4. The variable capacitor VC2 is disposed in a region other than a region defined by an outer perimeter that includes a side of the inductor L5 and a side of the inductor L3. Consequently, magnetic field coupling is caused between the inductor L5 and the inductor L3 and between the inductor L5 and the inductor L4 in the variable-frequency LC filter according to the third comparative example.

As illustrated in the characteristics diagram of FIG. 12A, because of an attenuation pole at a frequency faL' in the transmission characteristics of the LC filter circuit 44, attenuation increases at around 100 MHz in the transmission characteristics AC3 compared with the transmission characteristics AC2 (see FIG. 9A) of the variable-frequency LC filter 40A according to the second embodiment.

As illustrated in the characteristics diagram of FIG. 12A, the frequency faL of the attenuation pole on the lower frequency side in the transmission characteristics AC3 is closer to the center frequency f0 than that of the transmission characteristics CAC3 according to the third comparative example. The frequency faH of the attenuation pole on the higher frequency side in the transmission characteristics AC3 is closer to the center frequency f0 than that of the transmission characteristics CAC3 according to the third comparative example. Attenuation (dB) in the transmission characteristics AC3 is greater than attenuation in the transmission characteristics CAC3 from the frequency faL to the frequency f0. Likewise, attenuation (dB) in the transmission characteristics AC3 is greater than attenuation in the transmission characteristics CAC3 from the frequency f0 to the frequency faH. That is, the attenuation characteristics of the transmission characteristics AC3 are sharper than the attenuation characteristics of the transmission characteristics CAC3.

In addition, the above-described arrangement of the variable capacitor 422 makes electromagnetic field coupling less likely to occur between the path that passes through the inductor 441 and the path that passes through the inductor 421. The arrangement of the variable capacitor 432 makes electromagnetic field coupling less likely to occur between the path that passes through the inductor 441 and the path that passes through the inductor 431.

FIG. 13A is an external perspective view of a substrate on which a variable-frequency LC filter according to a fourth comparative example is mounted. FIG. 13B is an external perspective view of the substrate 400 on which the variable-frequency LC filter 40B is mounted. FIG. 13(C) is a diagram illustrating strength of a magnetic field caused in the external perspective view illustrated in FIG. 13A. FIG. 13D is a diagram illustrating strength of a magnetic field caused in the external perspective view illustrated in FIG. 13B. In FIG. 13(C) and FIG. 13D, line segments represent magnetic lines of force, and a higher density of magnetic lines of force indicates a stronger magnetic field. That is, a stronger magnetic field indicates that magnetic field coupling is caused between a plurality of inductors. In addition, the arrangement according to the fourth comparative example illustrated in FIG. 13A differs from the arrangement illustrated in FIG. 13B in that the variable capacitors 415, 432, and 422 are not disposed on the principal surface of the substrate 400.

As illustrated in FIG. 13A to FIG. 13D, the arrangement of the variable capacitor 415 weakens the magnetic field between the inductor 412 and the inductor 414. In addition, the arrangement of the variable capacitor 432 weakens the magnetic field between the inductor 412 and the inductor 414 and the magnetic field between the inductor 412 and the inductor 421. The arrangement of the variable capacitor 432 weakens the magnetic field between the inductor 412 and the inductor 441. The arrangement of the variable capacitor 422 weakens the magnetic field between the inductor 421 and the inductor 441.

The variable-frequency LC filters 40, 40A, and 40B described above are incorporated into a high-frequency frontend module and a communication apparatus for use in wireless communication using a TV white space, for example.

Figure 14:
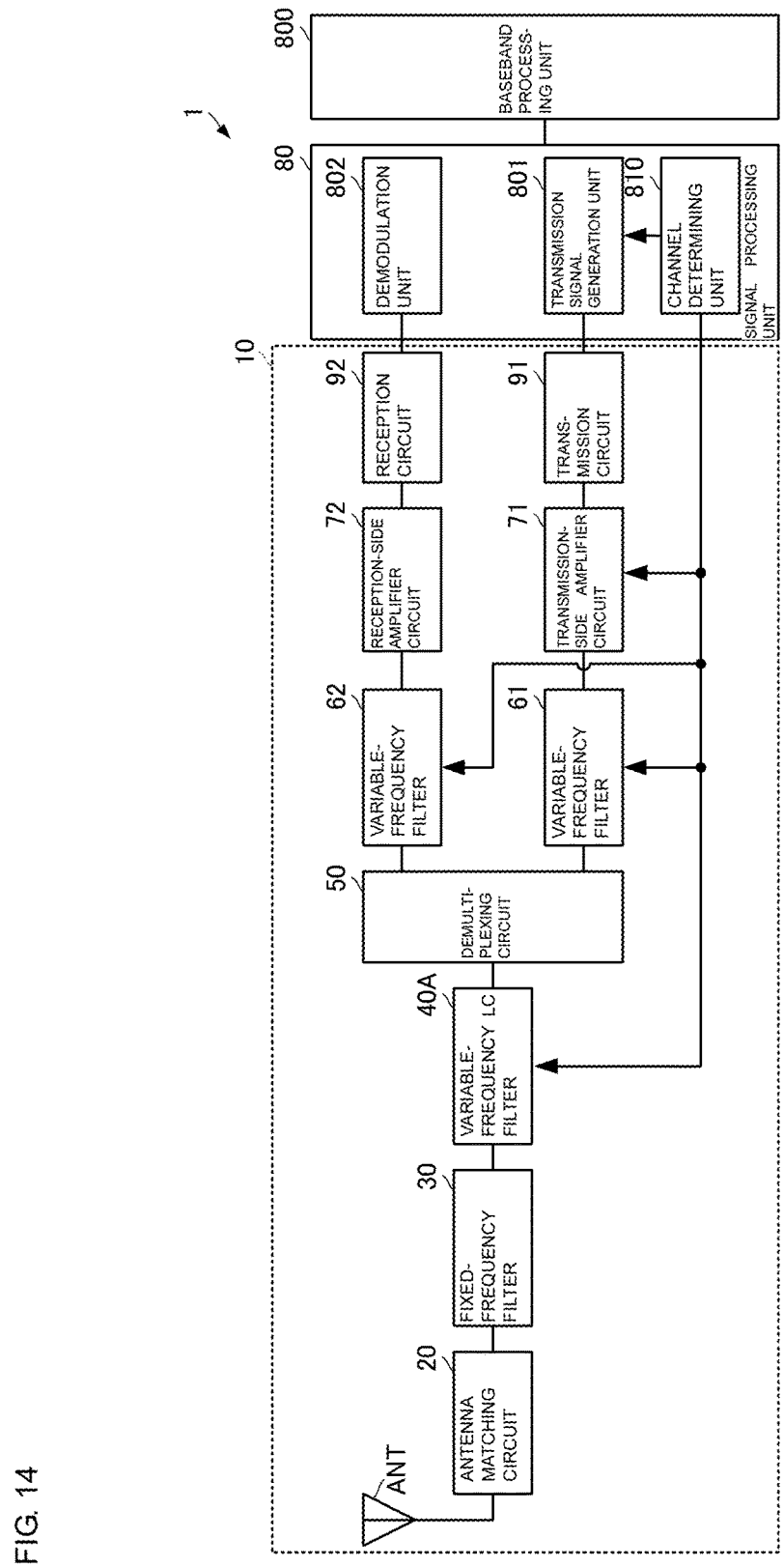
FIG. 14 is a functional block diagram of a high-frequency frontend module and a communication apparatus according to an embodiment of the present disclosure.

FIG. 14 is a functional block diagram of a high-frequency frontend module and a communication apparatus according to an embodiment of the present disclosure. As illustrated in FIG. 14, a communication apparatus 1 includes a high-frequency frontend module 10, a signal processing unit 80, and a baseband processing unit 800. The high-frequency frontend module 10 includes an antenna ANT, an antenna matching circuit 20, a fixed-frequency filter 30, the variable-frequency LC filter 40A, a demultiplexing circuit 50, variable-frequency filters 61 and 62, a transmission-side amplifier circuit 71, a reception-side amplifier circuit 72, a transmission circuit 91, and a reception circuit 92. The baseband processing unit 800 is connected to the signal processing unit 80 and performs signal processing of a baseband related to communication performed by the communication apparatus 1. The signal processing unit 80 includes a transmission signal generation unit 801, a demodulation unit 802, and a channel determining unit 810. The fixed-frequency filter 30 corresponds to a "fixed-frequency LC filter" according to the present disclosure, and each of the variable-frequency filters 61 and 62 corresponds to a "second variable-frequency filter" according to the present disclosure.

The high-frequency frontend module 10 includes at least the fixed-frequency filter 30, the variable-frequency LC filter 40A, and the variable-frequency filter 61. In this case, the fixed-frequency filter 30, the variable-frequency LC filter 40A, and the variable-frequency filter 61 are connected in series to each other in this order. Some or all of the components which are the demultiplexing circuit 50, the variable-frequency filter 62, the transmission-side amplifier circuit 71, the reception-side amplifier circuit 72, the transmission circuit 91, and the reception circuit 92 can be omitted.

In this embodiment, the variable-frequency LC filter 40A is used; however, the high-frequency frontend module 10 may use the variable-frequency LC filter 40 or the variable-frequency LC filter 40B in place of the variable-frequency LC filter 40A.

The antenna ANT is connected to the antenna matching circuit 20. The antenna matching circuit 20 is connected to the fixed-frequency filter 30. The fixed-frequency filter 30 is connected to the first connection terminal P401 of the variable-frequency LC filter 40A. The second connection terminal P402 of the variable-frequency LC filter 40A is connected to an antenna-side terminal of the demultiplexing circuit 50. A transmission-side terminal of the demultiplexing circuit 50 is connected to the variable-frequency filter 61. The variable-frequency filter 61 is connected to the transmission-side amplifier circuit 71. The transmission-side amplifier circuit 71 is connected to the transmission circuit 91. The transmission circuit 91 is connected to the transmission signal generation unit 801 of the signal processing unit 80. A reception-side terminal of the demultiplexing circuit 50 is connected to the variable-frequency filter 62.

The variable-frequency filter 62 is connected to the reception-side amplifier circuit 72. The reception-side amplifier circuit 72 is connected to the reception circuit 92. The reception circuit 92 is connected to the demodulation unit 802 of the signal processing unit 80.

The high-frequency frontend module 10 transmits and receives a high-frequency signal using an unused communication channel in a communication band constituted by a plurality of communication channels. More specifically, the high-frequency frontend module 10 transmits and receives a high-frequency signal based on specifications of the TV white space. According to the specifications of the TV white space, channels via which a television broadcasting signal is not transmitted in a UHF band (470 MHz to 790 MHz) of television broadcasting are used as unused communication channels. According to the specifications of the TV white space, a frequency bandwidth of a single channel is equal to 6 MHz. In addition, according to the specifications of the TV white space, a frequency gap between channels is equal to several MHz which is relatively narrow.

Figure 15:
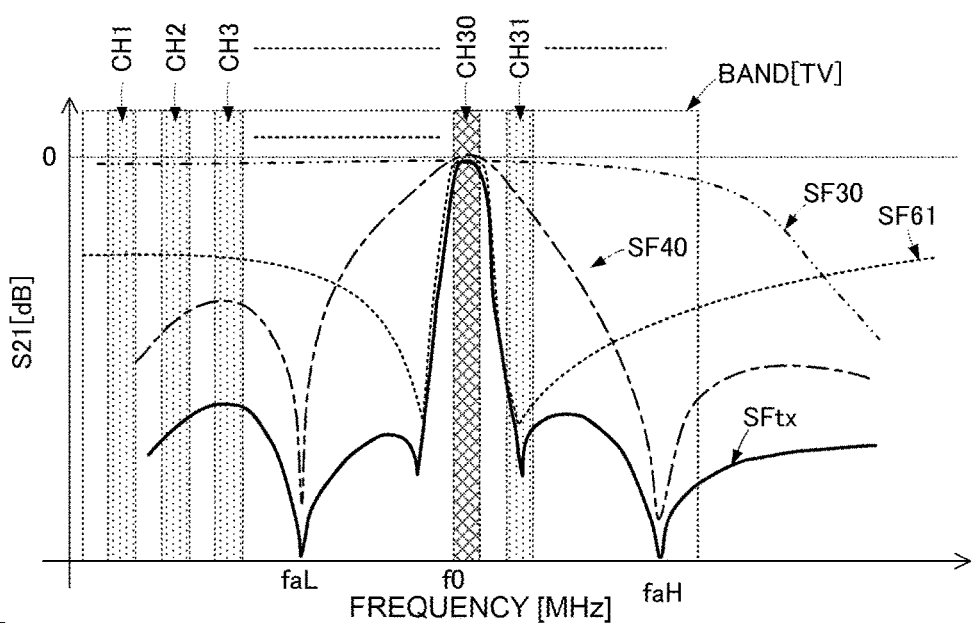
FIG. 15 is a diagram illustrating transmission characteristics of each filter included in the high-frequency frontend module.

FIG. 15 is a diagram illustrating transmission characteristics of the high-frequency frontend module 10 according to the embodiment of the present disclosure. FIG. 15 illustrates a relationship between a communication band and each communication channel. Note that FIG. 15 illustrates a case where a communication channel CH30 is a selected channel (unused communication channel with which the high-frequency frontend module 10 performs communication).

The antenna matching circuit 20 performs impedance matching between the antenna ANT and the fixed-frequency filter 30 and the subsequent circuits on the signal processing unit 80 side. The antenna matching circuit 20 includes an inductor and a capacitor. For example, element values of the inductor and the capacitor of the antenna matching circuit 20 are set such that a return loss of the antenna ANT is less than or equal to a desired value in the entire communication band.

The fixed-frequency filter 30 includes an inductor and a capacitor. That is, the fixed-frequency filter 30 is a fixed-frequency LC filter. The element values of the inductor and the capacitor of the fixed-frequency filter 30 are set such that a frequency band of the communication band is in a pass band and frequency bands outside the communication band are in an attenuation band. For example, the fixed-frequency filter 30 may be a low-pass filter having a cutoff frequency of 800 MHz. As illustrated by transmission characteristics SF30 in FIG. 15, the frequency band of the communication band is in the pass band of the fixed-frequency filter 30, and a frequency band higher than the frequency band of the communication band is in the attenuation band of the fixed-frequency filter 30. Consequently, the fixed-frequency filter 30 passes a high-frequency signal within the communication band at a low loss and attenuates high-frequency signals outside the communication band.

The variable-frequency LC filter 40A changes the pass band and the attenuation band in accordance with the selected channel. At that time, the frequency band of the selected channel is included in the pass band. As illustrated by transmission characteristics SF40 in FIG. 15, the frequency bandwidth of the pass band of the variable-frequency LC filter 40A is wider than the frequency bandwidth of the selected channel. For example, the frequency bandwidth of the pass band of the variable-frequency LC filter 40A is about 10 times as wide as the frequency bandwidth of the selected channel.

The variable-frequency LC filter 40A has attenuation poles on the respective sides of the pass band on the frequency axis. As illustrated by the transmission characteristics SF40 in FIG. 15, there is no frequency band in which attenuation decreases greatly in the attenuation band of the variable-frequency LC filter 40A and predetermined attenuation can be achieved at any frequency in the communication band outside the pass band.

With this configuration, the variable-frequency LC filter 40A passes a high-frequency signal of a frequency band of a plurality of channels including the selected channel at a low loss and attenuates high-frequency signals in the other frequency bands. Thus, the variable-frequency LC filter 40A can attenuate unnecessary waves located at frequencies separated from the frequency of the selected channel in the communication band. In particular, since the variable-frequency LC filter 40A can make the frequency range of the attenuation band wider than those of the variable-frequency filters 61 and 62 using resonators described below, the variable-frequency LC filter 40A is effective for attenuation of IMD that can occur in a wide frequency band in the communication band and that changes depending on the communication channel used (selected channel).

The demultiplexing circuit 50 includes a circulator, a duplexer, or the like. The demultiplexing circuit 50 outputs a transmission signal (high-frequency signal) input thereto from the transmission-side terminal to the antenna-side terminal, and outputs a reception signal (high-frequency signal) input thereto from the antenna-side terminal to the reception-side terminal.

The variable-frequency filters 61 and 62, each includes at least an elastic wave resonator and a variable capacitor. The elastic wave resonator is a resonator used for SAW or BAW, for example, i.e., a resonator that uses an elastic wave. Further, the variable-frequency filters 61 and 62, each includes at least one inductor and at least one capacitor depending on the transmission characteristics. That is, the variable-frequency filters 61 and 62 are variable-frequency resonator filters. The variable-frequency filters 61 and 62 are band-pass filters using a resonance point and an anti-resonance point of the resonator. Since the variable-frequency filters 61 and 62 have the same basic configuration, the variable-frequency filter 61 will be described below.

The variable-frequency filter 61 changes the pass band and the attenuation band in accordance with the selected channel. At that time, the frequency band of the selected channel is included in the pass band. As illustrated by transmission characteristics SF61 in FIG. 15, the frequency bandwidth of the pass band of the variable-frequency filter 61 is substantially equal to the frequency bandwidth of the selected channel (bandwidth of a single channel).

The variable-frequency filter 61 has attenuation poles on respective sides of the pass band on the frequency axis. Since the variable-frequency filter 61 is a resonator filter, the attenuation characteristics of the pass band are sharper than those of the LC filter as illustrated by the transmission characteristics SF61 in FIG. 15. Consequently, the variable-frequency filter 61 passes a high-frequency signal of the selected channel at a low loss and attenuates high-frequency signals of adjacent communication channels.

As illustrated by the transmission characteristics SF61 in FIG. 15, there is a frequency band in which attenuation decreases on a side opposite to the pass band with respect to the attenuation pole in the attenuation band of the variable-frequency filter 61. However, as a result of the variable-frequency filter 61, the variable-frequency LC filter 40A, and the fixed-frequency filter 30 being connected in series in the transmission path of the high-frequency signal, sufficient attenuation can be achieved by the variable-frequency LC filter 40A and the fixed-frequency filter 30 even in the frequency band in which attenuation is not achieved by the variable-frequency filter 61 sufficiently.

With such a configuration, a high-frequency signal of the selected channel can pass at a low loss and high-frequency signals of frequency bands other than the selected channel, including adjacent channels, can be attenuated as illustrated by total transmission characteristics SFtx in FIG. 15. Substantially the same effect can be obtained when the selected channel is switched.

The transmission-side amplifier circuit 71 includes an amplification element. The transmission-side amplifier circuit 71 amplifies a transmission signal generated by the transmission signal generation unit 801 and outputs the amplified transmission signal to the variable-frequency filter 61. The reception-side amplifier circuit 72 includes a so-called LNA (low noise amplifier). The reception-side amplifier circuit 72 amplifies a reception signal output from the variable-frequency filter 62 and outputs the amplified reception signal to the demodulation unit 802.

The channel determining unit 810 of the signal processing unit 80 detects unused communication channels in the communication band. For example, the channel determining unit 810 obtains an unused communication channel map from outside and detects unused communication channels on the basis of the map. The channel determining unit 810 selects at least one of the unused communication channels and sets the at least one unused communication channel as the selected channel. The channel determining unit 810 outputs the selected channel to the transmission signal generation unit 801. The transmission signal generation unit 801 generates a transmission signal which is a high-frequency signal having a frequency of the selected channel and outputs the transmission signal to the transmission-side amplifier circuit 71. Although not illustrated, the channel determining unit 810 outputs the selected channel to the demodulation unit 802. The demodulation unit 802 demodulates a reception signal using a local signal based on the selected channel.

The channel determining unit 810 outputs the selected channel also to the variable-frequency LC filter 40A, the transmission-side amplifier circuit 71, and the variable-frequency filters 61 and 62. The variable-frequency LC filter 40A and the variable-frequency filters 61 and 62 implement the transmission characteristics described above by using this selected channel. The transmission-side amplifier circuit 71 performs amplification processing on the transmission signal by using this selected channel.

As described above, the variable-frequency LC filter 40A implements sharper attenuation characteristics. Thus, when the variable-frequency LC filter 40A is used in the high-frequency frontend module 10, components of channels that are not selected can be effectively attenuated. This will be described with reference to FIG. 16.

Figure 16:
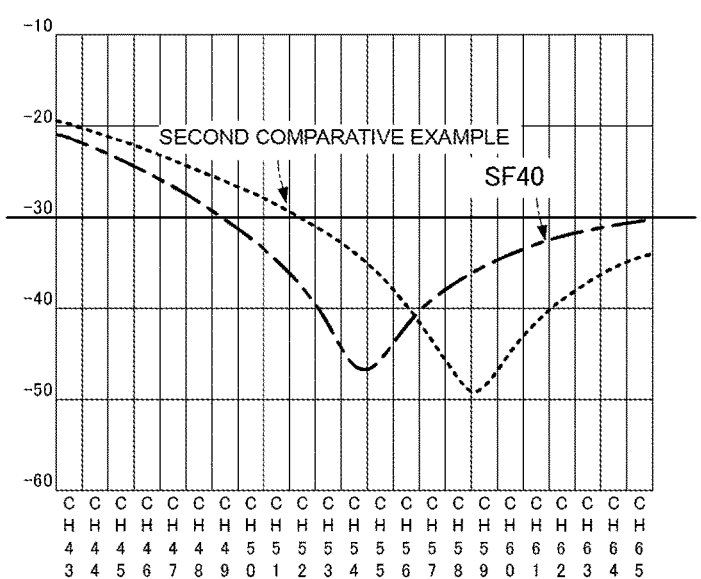
FIG. 16 is a partially enlarged diagram of the transmission characteristics illustrated in FIG. 15.

FIG. 16 is a partially enlarged diagram of the attenuation pole on the higher frequency side in the transmission characteristics SF40. In the example illustrated in the partially enlarged diagram of FIG. 16, a threshold is set to −30 dB. In the transmission characteristics SF40 of the variable-frequency LC filter 40A, the level of channels CH50 to CH52 is lower than −30 dB. In contrast, in the attenuation characteristics of the variable-frequency LC filter according to the second comparative example (example illustrated in FIG. 9B), the level of the channels CH50 to CH52 is higher than −30 dB. As described above, the variable-frequency LC filter 40A can sufficiently attenuate signals of unselected channels thanks to sharper attenuation characteristics thereof.

As described above, in the case of performing wireless communication using a communication channel (selected channel) selected in a communication band constituted by a plurality of communication channels, the use of the configuration of the high-frequency frontend module 10 according to the embodiment enables low-loss wireless communication to be implemented using the selected channel.

FIG. 17A is a schematic plan view of a main substrate 10M on which the high-frequency frontend module 10 is mounted. Note that illustration of part of the configuration of the high-frequency frontend module 10 is omitted in FIG. 17A.

As illustrated in FIG. 17A, the substrate 400 on which the variable-frequency LC filter 40 is mounted is disposed between the fixed-frequency filter 30 and the variable-frequency filter 61 and 62 on the main substrate 10M. On the principal surface of the substrate 400, the variable capacitor 432 is disposed between the inductors 412 and 431 and the variable-frequency filter 61 and 62. With this configuration, even if the variable-frequency filter 61 and 62 includes an inductor, the occurrence of unnecessary magnetic field coupling is suppressed between the inductor and the inductor 431. Since the occurrence of unnecessary magnetic field coupling is suppressed between the inductor of the variable-frequency filter 61 and 62 and the inductors 412 and 431, sharp attenuation characteristics of the variable-frequency LC filter 40 is less likely to be influenced by the unnecessary magnetic field coupling. Thus, the arrangement illustrated in FIG. 17A enables the variable-frequency LC filter 40 to be incorporated into the high-frequency frontend module 10 while maintaining the sharp attenuation characteristics of the variable-frequency LC filter 40.

Note that the variable-frequency filter 61 or 62 and the fixed-frequency filter 30 may be switched and connected to the variable-frequency LC filter 40. In this case, the variable capacitor 432 is disposed between the fixed-frequency filter 30 and the inductors 412 and 431. Thus, the occurrence of unnecessary magnetic field coupling is suppressed between the fixed-frequency filter 30 and the inductors 412 and 431 even when the variable-frequency filter 61 or 62 and the fixed-frequency filter 30 are switched and connected to the variable-frequency LC filter 40.

FIG. 17B is a schematic plan view of the main substrate 10M on which a high-frequency frontend module 10A including the variable-frequency LC filter 40A is mounted. In an arrangement example illustrated in FIG. 17B, the variable capacitor 422 is disposed between the inductor 421 and the fixed-frequency filter 30. With this configuration, the occurrence of unnecessary magnetic field coupling is suppressed between the inductor of the fixed-frequency filter 30 and the inductor 421. Since the occurrence of unnecessary magnetic field coupling is suppressed between the inductor of the fixed-frequency filter 30 and the inductor 421, sharp attenuation characteristics of the variable-frequency LC filter 40A is less likely to be influenced by the magnetic field coupling. Thus, the arrangement illustrated in FIG. 17B enables the variable-frequency LC filter 40A to be incorporated into the high-frequency frontend module 10 while maintaining the sharp attenuation characteristics of the variable-frequency LC filter 40A. In addition, as in the case of the arrangement illustrated in FIG. 17A, the occurrence of magnetic field coupling is suppressed between the inductor of the variable-frequency filter 61 or 62 and the inductor 431 by the arrangement of the variable capacitor 432.

Figure 18:
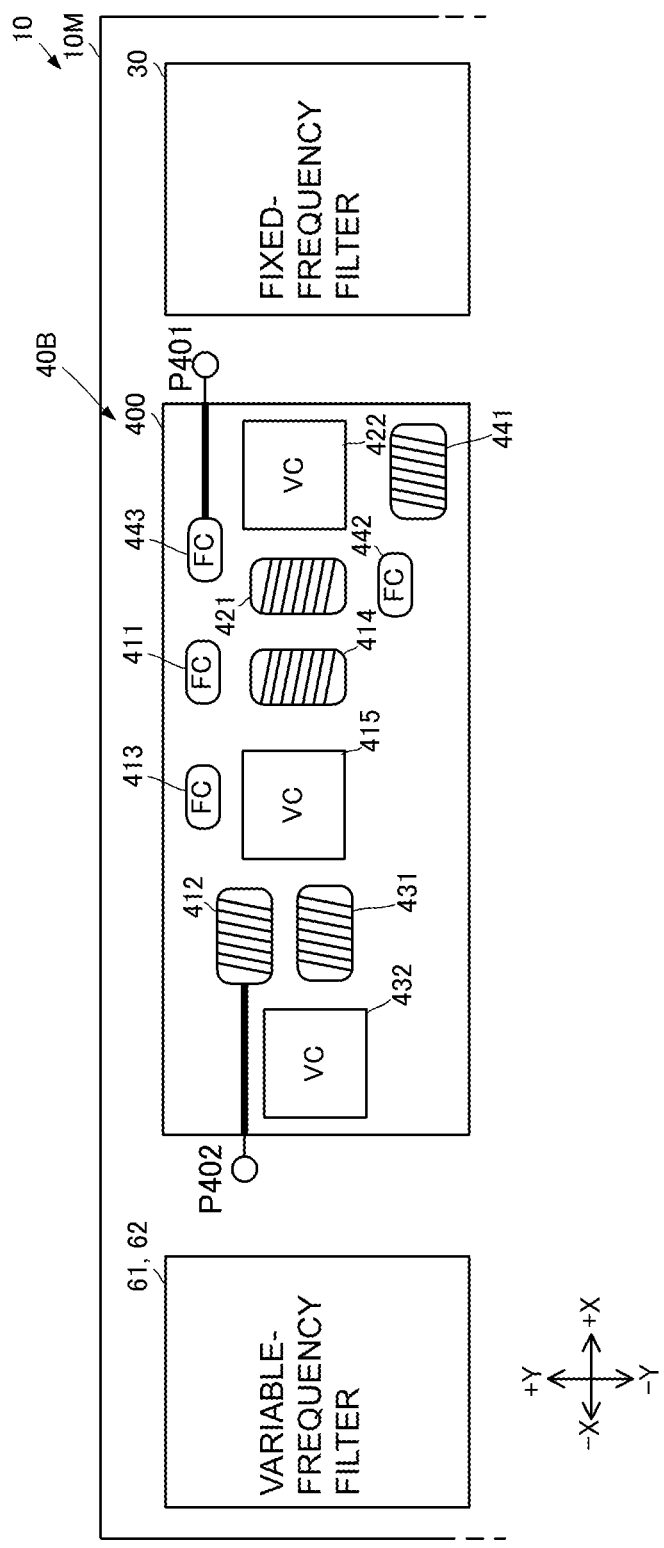
FIG. 18 is a diagram illustrating a substrate arrangement of a high-frequency frontend module including the variable-frequency LC filter according to the third embodiment of the present disclosure.

FIG. 18 is a schematic plan view of the main substrate 10M on which the high-frequency frontend module 10 including the variable-frequency LC filter 40B is mounted. The arrangement example illustrated in FIG. 18 is substantially the same as the arrangement illustrated in FIG. 17B. Thus, the occurrence of unnecessary magnetic field coupling is suppressed between the inductor of the fixed-frequency filter 30 and the inductor 421. In addition, the occurrence of unnecessary magnetic filed coupling is suppressed between the inductor of the variable-frequency filter 61 or 62 and the inductor 431. Thus, the arrangement illustrated in FIG. 18 enables the variable-frequency LC filter 40B to be incorporated into the high-frequency frontend module 10 while maintaining the sharp attenuation characteristics of the variable-frequency LC filter 40B.

Figure 19:
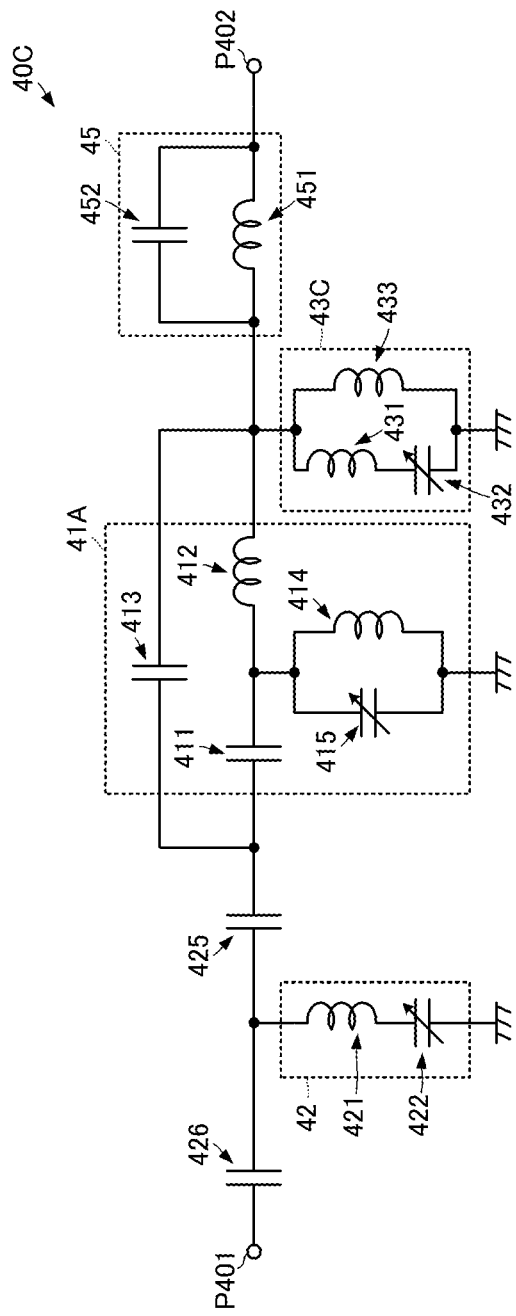
FIG. 19 is a circuit diagram of a variable-frequency LC filter according to a fourth embodiment of the present disclosure.

A variable-frequency LC filter 40C according to a fourth embodiment will be described next. FIG. 19 is a circuit diagram of the variable-frequency LC filter 40C.

The variable-frequency LC filter 40C according to this embodiment differs from the variable-frequency LC filter 40A according to the second embodiment in that the variable-frequency LC filter 40C includes a second parallel arm LC filter circuit 43C in place of the second parallel arm LC filter circuit 43 and includes a second series arm LC filter circuit 45, and capacitors 425 and 426. A description regarding the same configuration will be omitted.

As illustrated in FIG. 19, the second parallel arm LC filter circuit 43C additionally includes an inductor 433 compared with the second parallel arm LC filter circuit 43.

The inductor 433 is connected in parallel to the series circuit of the inductor 431 and the variable capacitor 432.

The second series arm LC filter circuit 45 includes an inductor 451 and a capacitor 452. The inductor 451 and the capacitor 452 are connected in parallel to each other. One end of the second series arm LC filter circuit 45 is connected to the second connection terminal P402. The other end of the second series arm LC filter circuit 45 is connected to a node of the first series arm LC filter circuit 41A and the second parallel arm LC filter circuit 43C.

A resonant frequency of a parallel resonance circuit of the inductor 451 and the capacitor 452 included in the second series arm LC filter circuit 45 is set to a frequency higher than a pass band of the variable-frequency LC filter 40C.

The capacitor 425 and the capacitor 426 are connected in series to each other. One end of the capacitor 425 is connected to the first series arm LC filter circuit 41A, and the other end of the capacitor 425 is connected to one end of the capacitor 426. The other end of the capacitor 426 is connected to the first connection terminal P401. The first parallel arm LC filter circuit 42 is connected between a ground potential and a node of the capacitor 425 and the capacitor 426.

Figure 20:
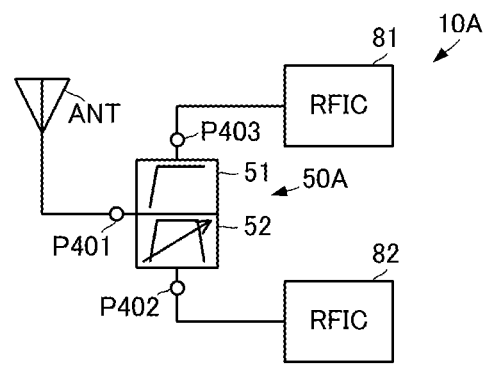
FIG. 20 is a circuit block diagram of a high-frequency frontend module.

The variable-frequency LC filter 40C having such a configuration is used in a circuit described below, for example. FIG. 20 is a circuit block diagram of the high-frequency frontend module 10A. As illustrated in FIG. 20, the high-frequency frontend module 10A includes an antenna ANT, a demultiplexing circuit 50A, and RFICs 81 and 82. The demultiplexing circuit 50A includes a high-pass filter 51 and a variable-frequency filter 52. That is, the demultiplexing circuit 50A is a variable-frequency diplexer. The demultiplexing circuit 50A includes the first connection terminal P401, the second connection terminal P402, and a third connection terminal P403. The high-pass filter 51 is connected between the first connection terminal P401 and the third connection terminal P403. The variable-frequency filter 52 is connected between the first connection terminal P401 and the second connection terminal P402. This variable-frequency filter 52 is implemented by the variable-frequency LC filter 40C.

The first connection terminal P401 is connected to the antenna ANT. The second connection terminal P402 is connected to the RFIC 82. The third connection terminal P403 is connected to the RFIC 81.

The variable-frequency LC filter 40C is implemented by a following component arrangement configuration. Each of FIG. 21, FIG. 22A, and FIG. 22B is a schematic plan view of the substrate on which the variable-frequency LC filter 40C is mounted.

Figure 21:
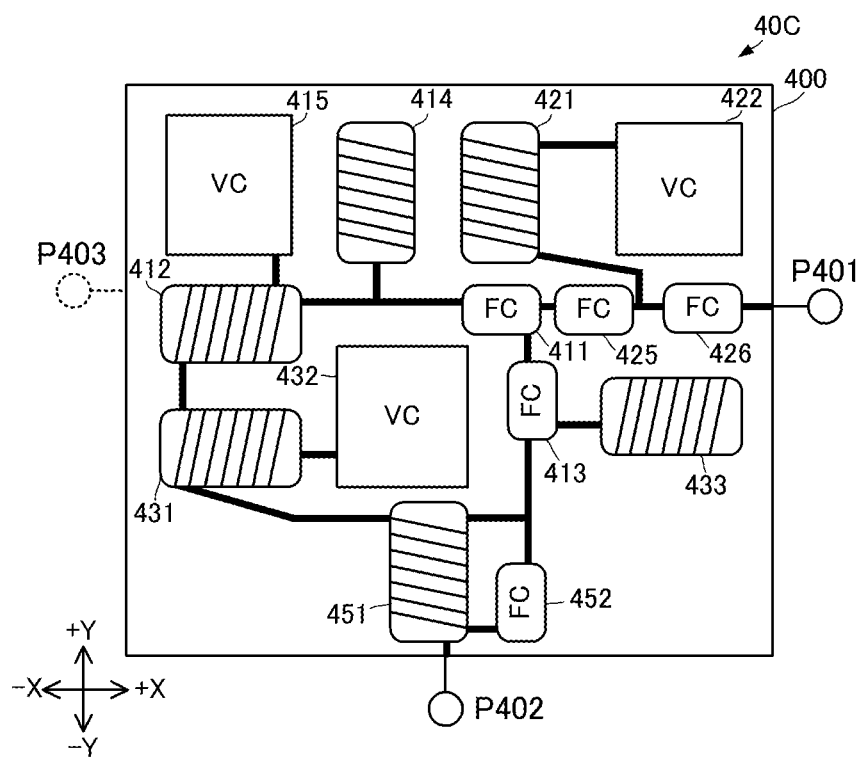
FIG. 21 is a schematic plan view of a substrate on which the variable-frequency LC filter according to the fourth embodiment of the present disclosure is mounted.

As illustrated in FIG. 21, the second connection terminal P402 is disposed on the −Y side substantially at the center in the X direction on the principal surface of the substrate 400.

The inductors 412 and 431 are disposed on the −X side in proximity to each other in the Y direction on the principal surface of the substrate 400 when the X direction denotes the wound-wire axis directions. The inductors 414 and 421 are disposed on the +Y side substantially at the center in the X direction on the principal surface of the substrate 400 when the Y direction denotes the wound-wire axis directions. The inductor 451 is disposed on the −Y side substantially at the center in the X direction on the principal surface of the substrate 400 when the Y direction denotes the wound-wire axis direction. The variable capacitor 432 is disposed substantially at the center in the Y direction and in the X direction on the principal surface of the substrate 400.

Figure 22A:
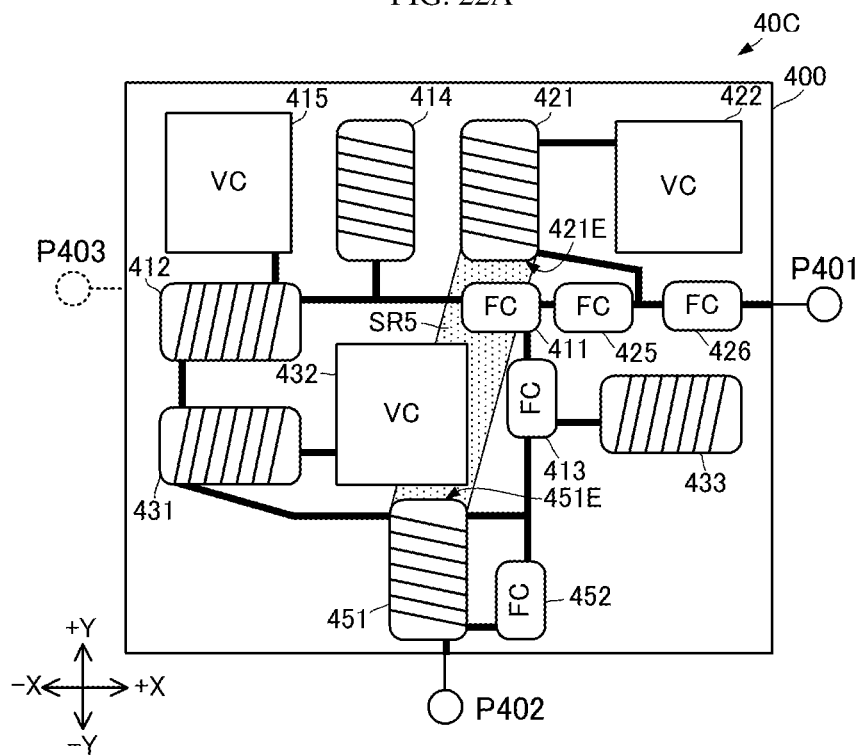
FIG. 22B is a schematic plan view of the substrate on which the variable-frequency LC filter according to the fourth embodiment of the present disclosure is mounted.
Figure 22B:
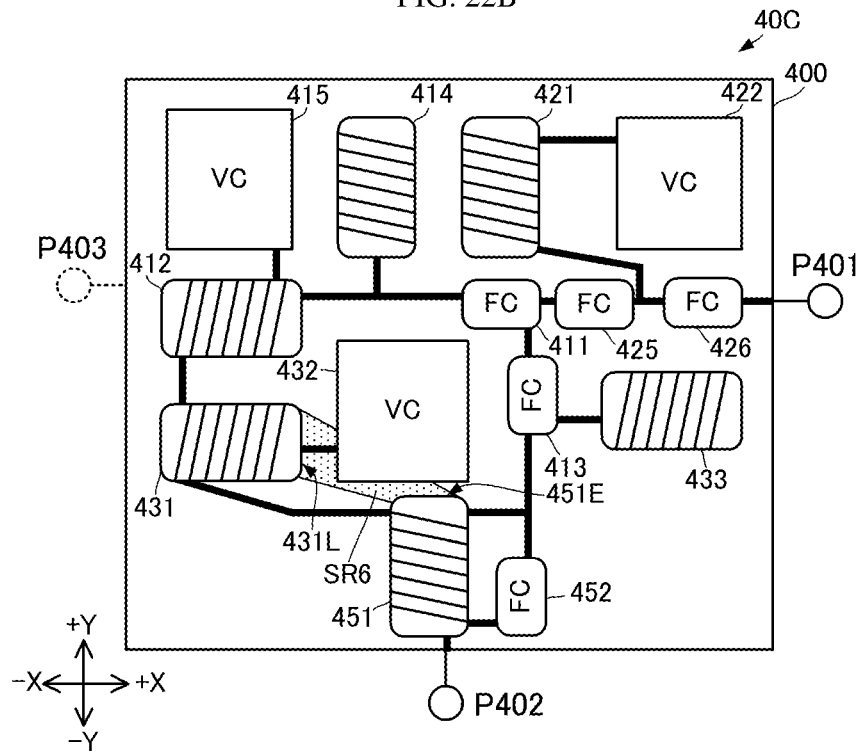

More specifically, as illustrated in the schematic plan view of FIG. 22A, a portion of the variable capacitor 432 is disposed in a region SR5 defined by an outer perimeter that includes a side of the inductor 421 and a side of the inductor 451. This region SR5 is a region obtained by viewing in plan a space having end faces 421E and 451E of the inductors 421 and 451 as two opposing lateral faces thereof.

With this arrangement, magnetic field coupling between the inductor 421 and the inductor 451 is suppressed.

In addition, as illustrated in the schematic plan view of FIG. 22B, a portion of the variable capacitor 432 is located in a region SR6 defined by an outer perimeter that includes a side of the inductor 431 and a side of the inductor 451. This region SR6 is a region obtained by viewing in plan a space having the end faces 431E and 451E of the inductors 431 and 451 as two opposing lateral faces.

With this arrangement, magnetic field coupling between the inductor 431 and the inductor 451 is suppressed.

Figure 23:
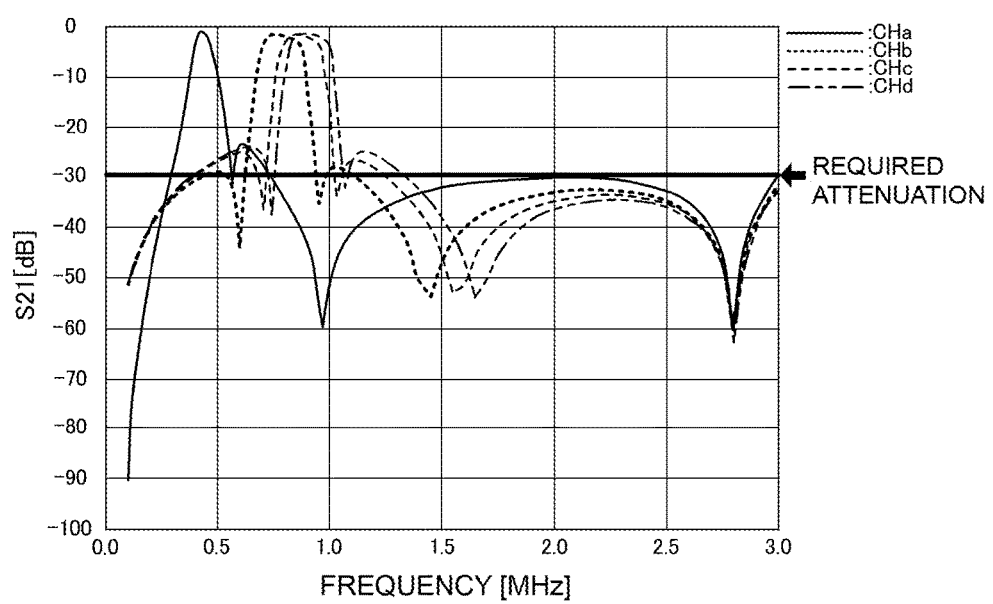
FIG. 23 is a diagram illustrating transmission characteristics of the variable-frequency LC filter according to the fourth embodiment of the present disclosure.

As a result of having such a configuration, the variable-frequency LC filter 40C can implement the following transmission characteristics. FIG. 23 is a diagram illustrating transmission characteristics of the variable-frequency LC filter 40C. In FIG. 23, a solid line denotes transmission characteristics of a channel CHa, a dot line denotes transmission characteristics of a channel CHb, a dash line denotes transmission characteristics of a channel CHc, and a two-dot-dash line denotes transmission characteristics of a channel CHd. For example, the channel CHa is a 430-MHz band, the channel CHb is a 770-MHz band, the channel CHc is an 865-MHz band, and the channel CHd is a 915-MHz band.

As illustrated in FIG. 23, a required attenuation of −30 [dB] can be achieved on a higher frequency side of the pass band thanks to the configuration of the variable-frequency LC filter 40C. At that time, the required attenuation can be achieved on the higher frequency side of the pass band when any of the channels is selected.

On the other hand, the required attenuation is not achieved in some cases without necessarily the configuration of the variable-frequency LC filter 40C as described below.

Figure 24A:
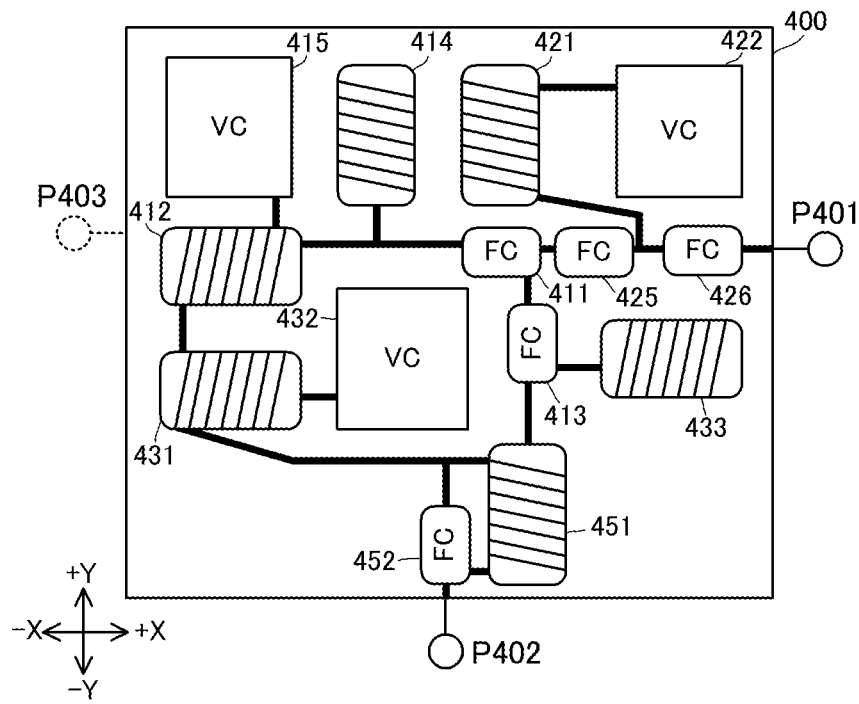
FIG. 24A is a schematic plan view of a substrate on which a variable-frequency filter according to a fifth comparative example is mounted.
Figure 24B:
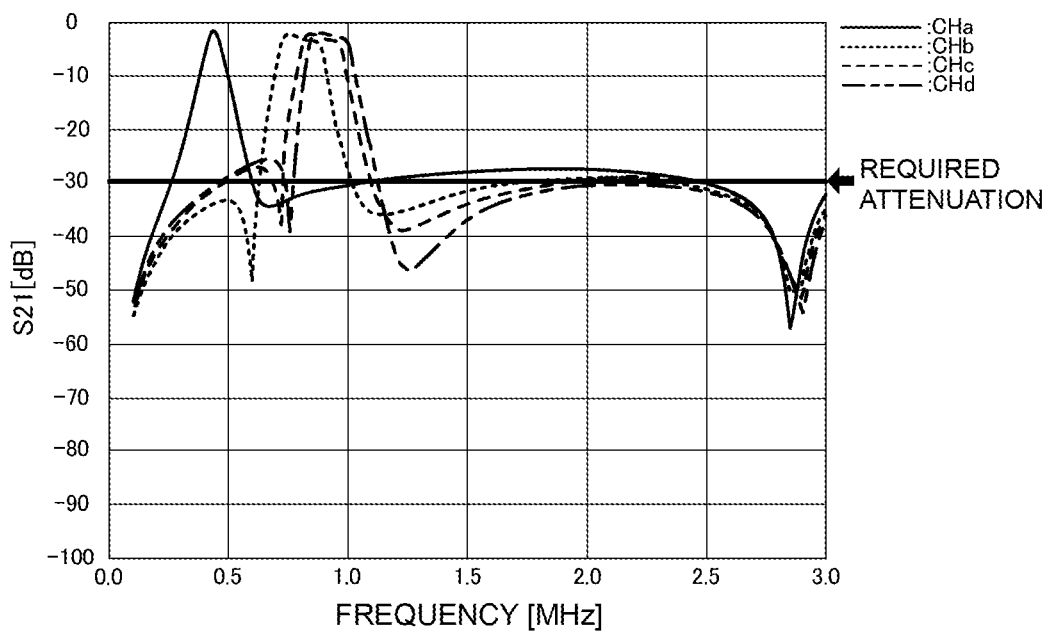
FIG. 24B is a diagram illustrating transmission characteristics of the variable-frequency filter according to the fifth comparative example.

FIG. 24A is a schematic plan view of a substrate on which a variable-frequency filter according to a fifth comparative example is mounted, and FIG. 24B is a diagram illustrating transmission characteristics of the variable-frequency filter.

As illustrated in FIG. 24A, the fifth comparative example has substantially the same circuit configuration as the variable-frequency LC filter 40C except for the configuration in which the variable capacitor 432 is not located in a region between the inductor 421 and the inductor 451. In this case, as illustrated in FIG. 24B, the channels CHa, CHb, and CHc have frequency bands in which the required attenuation is not achieved.

FIG. 25A is a schematic plan view of a substrate on which a variable-frequency filter according to a sixth comparative example is mounted, and FIG. 25B is a diagram illustrating transmission characteristics of the variable-frequency filter.

As illustrated in FIG. 25A, the sixth comparative example has substantially the same circuit configuration as the variable-frequency LC filter 40C except for the configuration in which the variable capacitor 432 is not located between the inductor 431 and the inductor 451. In this case, all the channels CHa, CHb, CHc, and CHd have frequency bands in which the required attenuation is not achieved as illustrated in FIG. 25B.

Although the configuration of using the variable-frequency LC filter 40C in the demultiplexing circuit 50A illustrated in FIG. 20 is shown in the above description, the variable-frequency LC filter 40C can be used as a separate, or sole variable-frequency LC filter and can be used in place of the variable-frequency LC filter 40A illustrated in FIG. 14.

In addition, the above-described characteristic arrangement of the variable-frequency LC filter 40C is also applicable to the variable-frequency LC filters 40 and 40A illustrated in FIG. 17 and the variable-frequency LC filter 40B illustrated in FIG. 18.

REFERENCE SIGNS LIST

P401 . . . first connection terminal
P402 . . . second connection terminal
P403 . . . third connection terminal
SR1-SR4 . . . region
1 . . . communication apparatus
10, 10A . . . high-frequency frontend module
20 . . . antenna matching circuit
30 . . . fixed-frequency filter
40, 40A, 40B, 40C . . . variable-frequency LC filter
41, 41A . . . filter circuit
42 . . . LC filter circuit
43 . . . LC filter circuit
44 . . . LC filter circuit
45 . . . LC filter circuit
50, 50A . . . demultiplexing circuit
51 . . . high-pass filter
61, 62 . . . variable-frequency filter
71 . . . transmission-side amplifier circuit
72 . . . reception-side amplifier circuit
80 . . . signal processing unit
81, 82 . . . RFIC
91 . . . transmission circuit
92 . . . reception circuit
400 . . . substrate
412, 414, 421, 431, 433, 441, 451 . . . inductor
411, 413, 425, 426, 442, 443, 452 . . . capacitor
415, 432, 422 variable capacitor
800 . . . baseband processing unit
801 . . . transmission signal generation unit
802 . . . demodulation unit
810 . . . channel determining unit

The invention claimed is:

1. A variable-frequency LC filter comprising:
an input terminal;
an output terminal;
a first series arm LC filter circuit comprising a first inductor and connected between the input terminal and the output terminal;
a first parallel arm LC filter circuit comprising a second inductor and a first variable capacitor, the first parallel arm LC filter circuit being connected between ground and a node between the input terminal and the first series arm LC filter circuit; and
a second parallel arm LC filter circuit comprising a third inductor and a second variable capacitor, the second parallel arm LC filter circuit being connected between ground and a node between the output terminal and the first series arm LC filter circuit, wherein:
the input terminal, the output terminal, the first series arm LC filter circuit, the first parallel arm LC filter circuit, and the second parallel arm LC filter circuit are mounted on a principal surface of a substrate,
the second parallel arm LC filter circuit is directly connected to the first inductor, and
the first variable capacitor and the second variable capacitor are disposed on the principal surface in an arrangement such that a strength of a magnetic field coupling between the first inductor and the third inductor is greater than a strength of a magnetic field coupling between the second inductor and the first inductor, and is greater than a strength of a magnetic field coupling between the second inductor and the third inductor.

2. The variable-frequency LC filter according to claim 1, wherein the first variable capacitor and the second variable capacitor are not disposed in a region of the principal surface defined by an outer perimeter that includes a side of the first inductor and a side of the third inductor, and
wherein a portion of the first or second variable capacitor is located in a region of the principal surface defined by an outer perimeter that includes a side of the second inductor and the side of the first inductor or the side of the third inductor.

3. The variable-frequency LC filter according to claim 2, wherein the side of the first inductor or the side of the second inductor is an end or a lateral face thereof.

4. The variable-frequency LC filter according to claim 1, wherein the first, second, and third inductors are wire-wound inductors disposed on the principal surface such that a winding axis direction of the second inductor is different from winding axis directions of the first and third inductors.

5. The variable-frequency LC filter according to claim 1, wherein the second inductor is disposed closer to a first end of the principal surface along a predetermined direction than the first inductor and the third inductor, and
wherein the first inductor and the third inductor are disposed closer to a second end of the principal surface along the predetermined direction than the second inductor, the second end being opposite the first end.

6. The variable-frequency LC filter according to claim 1, wherein the first series arm LC filter circuit comprises:
a parallel LC filter circuit comprising a third variable capacitor and a fourth inductor, and that is connected between ground and a path between the input terminal and the output terminal, and
a fixed capacitor connected in parallel to the first inductor,
wherein the first variable capacitor, the second variable capacitor, and the third variable capacitor are not located in a region of the principal surface defined by an outer perimeter that includes a side of the first inductor and a side of the third inductor, and
wherein a portion of the first, second, or third variable capacitor is located in a region of the principal surface defined by an outer perimeter that includes the side of the first inductor and a side of the fourth inductor.

7. The variable-frequency LC filter according to claim 6, wherein the side of the first, second, third, or fourth inductor is an end or lateral face thereof.

8. The variable-frequency LC filter according to claim 7, further comprising:
a third parallel arm LC filter circuit connected between ground potential and another node between the input terminal and the first series arm LC filter circuit,
wherein the third parallel arm LC filter circuit comprises:
a fixed capacitor connected between the input terminal and the first series arm LC filter circuit, and
a fifth inductor and a fixed capacitor connected in series with each other between ground potential and a node between the fixed capacitor and the input terminal, and
wherein a portion of the first, second, or third variable capacitor is located in a region of the principal surface defined by an outer perimeter that includes a side of the fifth inductor and a side of the second inductor.

9. The variable-frequency LC filter according to claim 1, further comprising:
a second series arm LC filter circuit connected between the output terminal and the first series arm LC filter circuit,
wherein the second series arm LC filter circuit comprises:
a sixth inductor and a fixed capacitor connected in parallel to each other between the output terminal and the first series arm LC filter circuit, and
wherein a portion of the second variable capacitor is located:
in a region of the principal surface defined by an outer perimeter that includes a side of the second inductor and a side of the sixth inductor, and
in a region of the principal surface defined by an outer perimeter includes a side of the third inductor and the side of the sixth inductor.

10. A high-frequency frontend module comprising:
the variable-frequency LC filter according to claim 1;
a fixed-frequency LC filter connected to the input terminal of the variable-frequency LC filter; and
a second variable-frequency filter connected to the output terminal of the variable-frequency LC filter.

11. The high-frequency frontend module according to claim 10,
wherein a pass band of the fixed-frequency LC filter includes a pass band of the variable-frequency LC filter, and
wherein the pass band of the variable-frequency LC filter includes a pass band of the second variable-frequency filter.

12. The high-frequency frontend module according to claim 11, further comprising:
a main substrate on which the substrate, the fixed-frequency LC filter, and the second variable-frequency filter are mounted,
wherein at least one of the first variable capacitor and the second variable capacitor is disposed on a principal surface of the main substrate and arranged between the second inductor and the second variable-frequency filter, or between the second inductor and the fixed-frequency LC filter.

13. The high-frequency frontend module according to claim 10, wherein a pass band of the variable-frequency LC filter includes a frequency band of a TV white space.

14. The high-frequency frontend module according to claim 10, further comprising:
   a transmission circuit configured to generate a transmission signal; and
   an amplifier circuit configured to amplify the transmission signal.

15. A communication apparatus comprising:
   the high-frequency frontend module according to claim 14;
   a signal processing circuit configured to perform signal processing on the transmission signal and on a reception signal that passes through the second variable-frequency filter; and
   a baseband processing circuit configured to perform signal processing of a baseband of communication using the transmission signal and the reception signal.

* * * * *